United States Patent
Joe et al.

(10) Patent No.: US 11,152,074 B2
(45) Date of Patent: Oct. 19, 2021

(54) MEMORY DEVICE WITH IMPROVED PROGRAM PERFORMANCE AND METHOD OF OPERATING THE SAME

(71) Applicant: SAMSUNG ELECTRONICS CO., LTD., Suwon-si (KR)

(72) Inventors: Sung-Min Joe, Seoul (KR); Kang-Bin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/998,273

(22) Filed: Aug. 20, 2020

(65) Prior Publication Data

US 2020/0381065 A1  Dec. 3, 2020

Related U.S. Application Data

(63) Continuation-in-part of application No. 16/927,100, filed on Jul. 13, 2020, which is a continuation-in-part
(Continued)

(30) Foreign Application Priority Data

Feb. 28, 2018 (KR) ........................ 10-2018-0024728

(51) Int. Cl.
  *G11C 16/10* (2006.01)
  *G11C 16/34* (2006.01)
  (Continued)

(52) U.S. Cl.
  CPC ........ *G11C 16/3404* (2013.01); *G11C 7/1048* (2013.01); *G11C 16/0433* (2013.01);
  (Continued)

(58) Field of Classification Search
  CPC .. G11C 16/10; G11C 7/12; G11C 8/14; G11C 11/4091; G11C 16/0483
  (Continued)

(56) References Cited

U.S. PATENT DOCUMENTS

| | | |
|---|---|---|
| 7,859,902 B2 | 12/2010 | Maejima |
| 8,248,853 B2 | 8/2012 | Lee et al. |
| 8,385,115 B2 | 2/2013 | Lee et al. |
| 8,654,587 B2 | 2/2014 | Yoon et al. |

(Continued)

FOREIGN PATENT DOCUMENTS

KR  1020100013950  2/2010

OTHER PUBLICATIONS

Office Action dated Dec. 13, 2019 in Corresponding U.S. Appl. No. 16/257,768.
(Continued)

*Primary Examiner* — Xiaochun L Chen
(74) *Attorney, Agent, or Firm* — F. Chau & Associates, LLC

(57) ABSTRACT

A memory device includes a memory cell region including a first metal pad, a peripheral circuit region including a second metal pad and connected to the memory cell region by the first and second metal pads, and a memory cell array in the memory cell region and including cell strings. The cell strings include memory cells, word lines and dummy lines connected to the memory cells, bit lines connected to one side of the cell strings, and a ground selection line connected to the cell strings. The memory device further includes control logic in the peripheral circuit region and including a precharge control circuit that controls a precharge on partial cell strings among the cell strings and controls data program steps on the memory cells, and a row decoder in the peripheral circuit region that activates at least some of the word lines based on control of the control logic.

16 Claims, 22 Drawing Sheets

Related U.S. Application Data of application No. 16/257,768, filed on Jan. 25, 2019, now Pat. No. 10,714,184.

(51) Int. Cl.
    *G11C 16/28*     (2006.01)
    *H01L 23/00*     (2006.01)
    *G11C 16/24*     (2006.01)
    *G11C 16/04*     (2006.01)
    *G11C 7/10*     (2006.01)
    *G11C 16/08*     (2006.01)

(52) U.S. Cl.
    CPC .............. *G11C 16/08* (2013.01); *G11C 16/10* (2013.01); *G11C 16/24* (2013.01); *G11C 16/28* (2013.01); *H01L 24/27* (2013.01)

(58) Field of Classification Search
    USPC ...................................................... 365/185.25
    See application file for complete search history.

(56) References Cited

U.S. PATENT DOCUMENTS

| | | |
|---|---|---|
| 8,988,937 B2 | 3/2015 | Dunga et al. |
| 8,988,939 B2 | 3/2015 | Dunga et al. |
| 9,558,833 B2 | 1/2017 | Maejima |
| 9,691,472 B2 | 6/2017 | Kang |
| 10,714,184 B2 | 7/2020 | Joe et al. |
| 2010/0054036 A1 | 3/2010 | Lee et al. |
| 2011/0194351 A1* | 8/2011 | Kim .................. G11C 16/0483 365/185.17 |
| 2011/0222342 A1 | 9/2011 | Yoon et al. |
| 2012/0020153 A1 | 1/2012 | Joo |
| 2018/0182463 A1 | 6/2018 | Dutta et al. |
| 2019/0267092 A1 | 8/2019 | Joe et al. |
| 2019/0273090 A1 | 9/2019 | Fukuzumi et al. |

OTHER PUBLICATIONS

Office Action dated Jun. 16, 2021 In Corresponding U.S. Appl. No. 16/927,100.

* cited by examiner

FIG. 3

|  |  | BL[1] | BL[2] | BL[3] | ... |
|---|---|---|---|---|---|
|  | ⋮ |  |  |  |  |
| WL[3] | 2nd PGM |  |  |  | ... |
|  | 1st PGM | 4 | 4 | 4 |  |
| WL[2] | 2nd PGM | 5 | 5 | 5 |  |
|  | 1st PGM | 2 | 2 | 2 |  |
| WL[1] | 2nd PGM | 3 | 3 | 3 |  |
|  | 1st PGM | 1 | 1 | 1 |  |

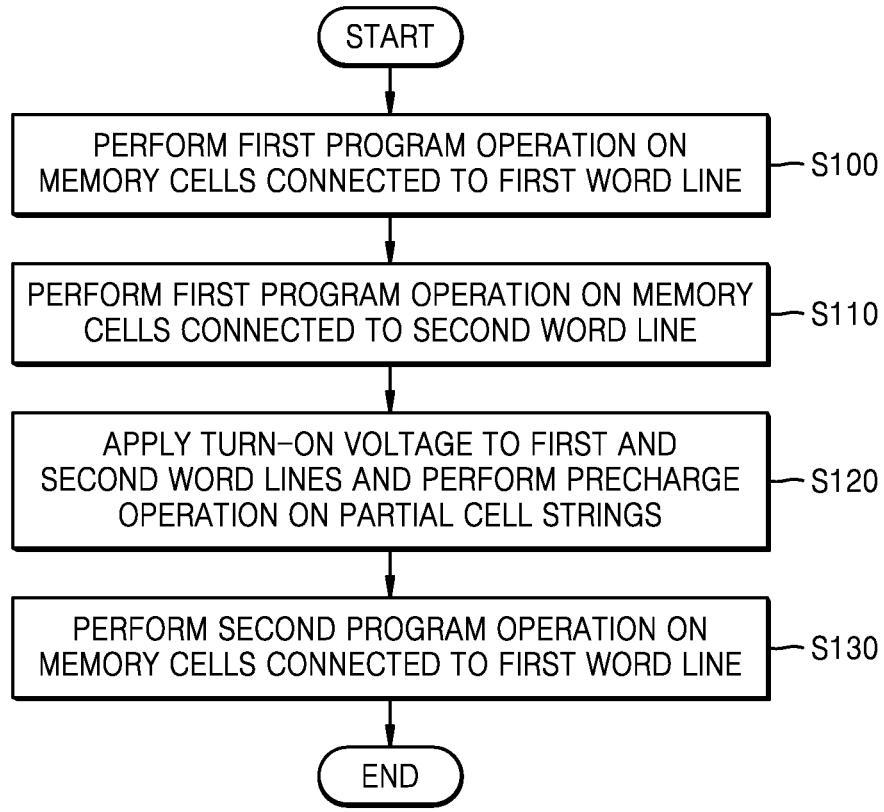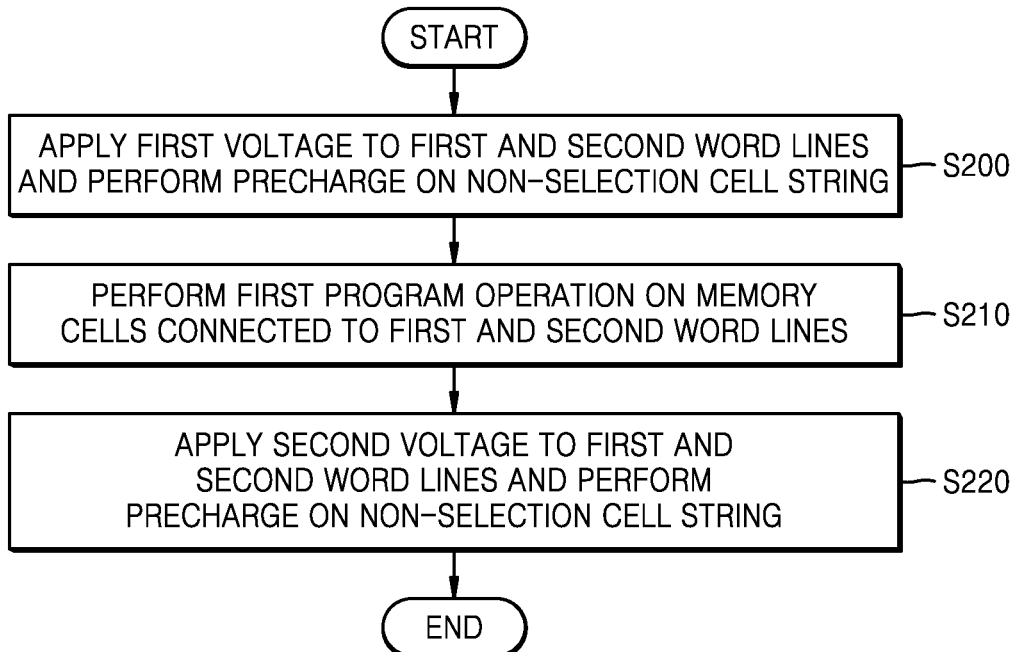

MEMORY DEVICE WITH IMPROVED PROGRAM PERFORMANCE AND METHOD OF OPERATING THE SAME

CROSS-REFERENCE TO RELATED APPLICATIONS

This application is a continuation-in-part of U.S. patent application Ser. No. 16/927,100 filed Jul. 13, 2020, which is a continuation-in-part application of U.S. Ser. No. 16/257,768, filed on Jan. 25, 2019, which issued as U.S. Pat. No. 10,714,184 on Jul. 14, 2020, which claims priority under 35 U.S.C. § 119 to Korean Patent Application No. 10-2018-0024728, filed on Feb. 28, 2018 in the Korean Intellectual Property Office, the disclosures of which are incorporated by reference herein in their entirety.

TECHNICAL FIELD

Exemplary embodiments of the inventive concept relate to a memory device, and more particularly, to a memory device with improved program performance.

DISCUSSION OF RELATED ART

A non-volatile memory device is a type of semiconductor memory device that includes a plurality of memory cells storing data in a non-volatile manner. A flash memory system is a type of non-volatile memory device widely used in universal serial bus (USB) drives, digital cameras, mobile telephones, smartphones, tablet computers (PC), memory cards, solid state drives (SSD), etc.

SUMMARY

According to an exemplary embodiment of the inventive concept, a memory device includes a memory cell region, a peripheral circuit region, a memory cell array, a control logic, and a row decoder. The memory cell region includes a first metal pad. The peripheral circuit region includes a second metal pad and vertically connected to the memory cell region by the first metal pad and the second metal pad. The memory cell array in the memory cell region includes a plurality of cell strings including a plurality of memory cells, a plurality of word lines connected to the plurality of memory cells, a plurality of dummy word lines respectively connected to the plurality of memory cells, a plurality of bit lines connected to one side of the plurality of cell strings, and a ground selection line connected to the plurality of cell strings. The control logic in the peripheral circuit region includes a precharge control circuit for controlling precharge on partial cell strings among the plurality of cell strings and controls a plurality of data program steps on the plurality of memory cells. The row decoder in the peripheral circuit region activates at least some of the plurality of word lines in response to a control of the control logic. The precharge control circuit controls the row decoder so that, during the precharge on the partial cell strings, a turn-on voltage is applied to a selection word line and a word line adjacent to the selection word line, among the plurality of word lines, and that a voltage at a level lower than that of the turn-on voltage is applied to another word line. A voltage applied to the ground selection line increases during the precharge on the partial cell strings. A dummy word line voltage applied to the dummy word lines is lower than the the turn-on voltage.

According to an exemplary embodiment of the inventive concept, in a method of operating a memory device in a Solid State Drive (SSD) including a memory cell array including a plurality of cell strings including a plurality of memory cells, a plurality of a plurality of word lines connected to the plurality of memory cells, a plurality of dummy word lines respectively connected to the plurality of memory cells, and a plurality of bit lines connected to one side of the plurality of cell strings, the method includes performing a first program operation on memory cells connected to a first word line among the plurality of word lines, performing the first program operation on memory cells connected to a second word line among the plurality of word lines, applying a turn-on voltage at a first level to the first and second word lines, applying a voltage at a level lower than the first level to a third word line among the plurality of word lines, performing a precharge operation on partial cell strings among the plurality of cell strings, and performing a second program operation on memory cells connected to the first word line. The memory cell array further includes one or more common source lines connected the other side of the plurality of cell strings. The performing the precharge operation on the partial cell strings includes increasing a voltage applied to the one or more common source lines to a precharge voltage. A dummy word line voltage applied to the dummy word lines is lower than the the turn-on voltage.

According to an exemplary embodiment of the inventive concept, a memory device in a Solid State Drive (SSD) includes a memory cell region, a peripheral circuit region, a memory cell array, a control logic, and a row decoder. The memory cell region includes a first metal pad. The peripheral circuit region includes a second metal pad and vertically connected to the memory cell region by the first metal pad and the second metal pad. The memory cell array in the memory cell region includes a plurality of cell strings including a plurality of memory cells, a plurality of word lines connected to the plurality of memory cells, a plurality of dummy word lines respectively connected to the plurality of memory cells, a plurality of bit lines connected to one side of the plurality of cell strings, and a ground selection line connected to the plurality of cell strings. The control logic in the peripheral circuit region includes a precharge control circuit for controlling precharge on partial cell strings among the plurality of cell strings and controls a plurality of data program steps on the plurality of memory cells. The row decoder in the peripheral circuit region activates at least some of the plurality of word lines in response to a control of the control logic. The precharge control circuit controls the row decoder so that, during the precharge on the partial cell strings, a turn-on voltage is applied to a selection word line and a word line adjacent to the selection word line, among the plurality of word lines, and that a voltage at a level lower than that of the turn-on voltage is applied to another word line. A voltage applied to a selection bit line increases during the precharge on the partial cell strings. A dummy word line voltage applied to the dummy word lines is lower than the turn-on voltage.

BRIEF DESCRIPTION OF THE DRAWINGS

The above and other features of the inventive concept will be more clearly understood by describing in detail exemplary embodiments thereof with reference to the accompanying drawings.

FIG. 3 is a view illustrating a program operation an exemplary embodiment of the inventive concept.

FIG. 8 is a flowchart illustrating a method of operating a memory device, according to an exemplary embodiment of the inventive concept.

FIG. 9 is a flowchart illustrating a method of operating a memory device, according to an exemplary embodiment of the inventive concept.

DETAILED DESCRIPTION OF THE EMBODIMENTS

Figures 1, 2A:
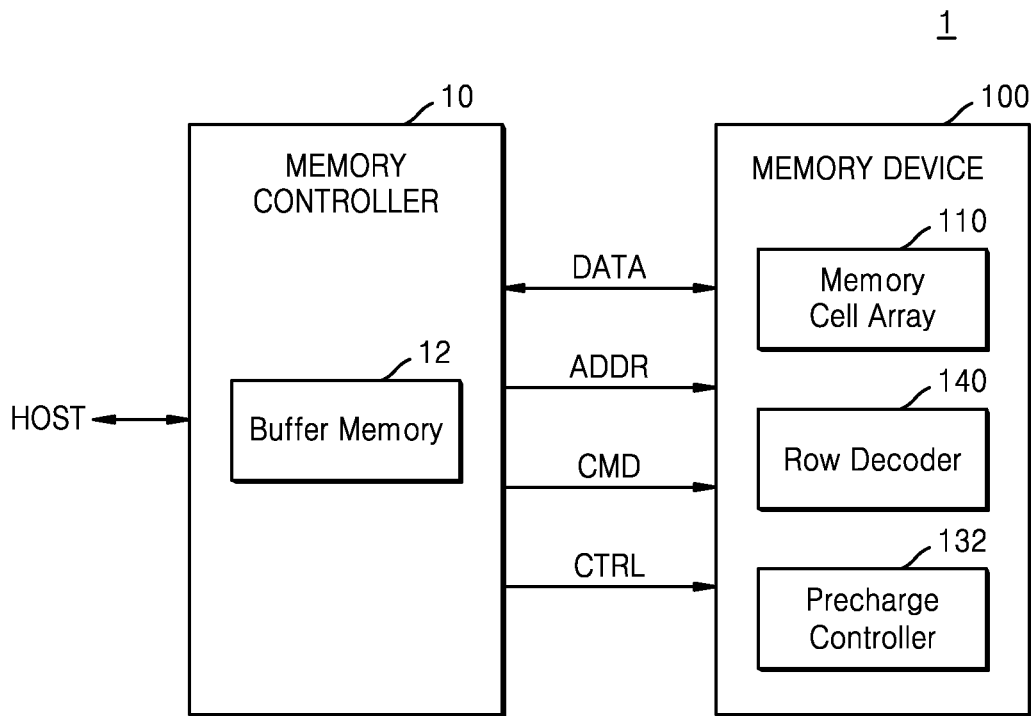
FIG. 1 is a block diagram illustrating a memory system according to an exemplary embodiment of the inventive concept.
FIGS. 2A to 2C are views illustrating a program operation according to an exemplary embodiment of the inventive concept.

Exemplary embodiments of the inventive concept provide a memory device with improved program performance and a method of operating the same, as well as a memory device that controls a voltage applied to a word line during a precharge operation and a method of operating the same.

Exemplary embodiments of the inventive concept will be described more fully hereinafter with reference to the accompanying drawings. Like reference numerals may refer to like elements throughout this application.

FIG. 1 is a block diagram illustrating a memory system according to an exemplary embodiment of the inventive concept. Referring to FIG. 1, a memory system 1 may include a memory controller 10 and a memory device 100. The memory controller 10 may include a buffer memory 12. The memory device 100 may include a memory cell array 110, a row decoder 140, and a precharge control circuit 132.

In exemplary embodiments of the inventive concept, the memory system 1 may be implemented by an internal memory mounted in an electronic device, for example, an embedded universal flash storage (UFS) memory device, an embedded multi-media card (eMMC), or a solid state drive (SSD). In exemplary embodiments of the inventive concept, the memory system 1 may be implemented by an external memory that may be detachably attached to the electronic device, for example, a UFS memory card, a compact flash (CF) card, a secure digital (SD) card, a micro secure digital (micro-SD) card, a mini secure digital (mini-SD) card, an extreme digital (xD) card, or a memory stick.

The memory controller 10 may control the memory device 100 to read data stored in the memory device 100 or to program data in the memory device 100 in response to a recording/reading request from a host HOST. In detail, the memory controller 10 may control program, read, and erase operations for the memory device 100 by providing an address signal ADDR, a command signal CMD, and a control signal CTRL to the memory device 100. In addition, data DATA to be programmed and read data DATA may be transmitted and received between the memory controller 10 and the memory device 100.

The buffer memory 12 provided in the memory controller 10 may temporarily store data transmitted from the host HOST and data DATA read from the memory device 100. For example, the data transmitted from the host HOST is data DATA to be programmed in the memory cell array 110 and may be written in the memory cell array 110 through a plurality of data program steps.

In an exemplary embodiment of the inventive concept, based on first data items stored in the buffer memory 12, a first program operation for memory cells connected to a first word line of the memory cell array 110 may be performed. Then, based on second data items stored in the buffer memory 12, the first program operation for memory cells connected to a second word line of the memory cell array 110 is performed. Then, a second program operation for memory cells connected to the first word line may be performed based on the first data items.

For example, the first program operation may be a pre-program operation and the second program operation may be a reprogram operation for the first program operation. As another example, the first and second program operations may be a shadow program operation, which will be described in detail below.

For example, the memory device 100 may be formed of a single memory chip. As another example, the memory device 100 may be formed of a plurality of memory chips. One memory chip may be formed of a single die or a plurality of dies. One die may be formed of a single plane or a plurality of planes. One plane includes a plurality of memory blocks. Each of the memory blocks includes a plurality of pages. Each of the plurality of pages may include a plurality of sectors.

The memory cell array 110 may include a plurality of memory cells, for example, flash memory cells. The memory cell array 110 may include a plurality of cell strings (or NAND strings) respectively connected to points at which a plurality of string selection lines and a plurality of bit lines intersect. Each of the cell strings may include a plurality of memory cells. For example, the cell string may be implemented to extend in a perpendicular direction from a semiconductor substrate. Therefore, each of the cell strings may include a plurality of memory cells positioned to be perpendicular based on the semiconductor substrate. The memory cells included in the cell strings may be connected to a plurality of word lines.

In an exemplary embodiment of the inventive concept, before a program operation for a memory cell, a precharge operation for partial cell strings among the plurality of cell strings may be performed. For example, the precharge control circuit 132 may control the row decoder 140 so that a precharge operation is performed for a non-selection cell string before the program operation for the memory.

During the precharge operation, a precharge voltage may be applied to the non-selection cell string. For example, the precharge voltage may be applied to the non-selection cell string through a bit line. As another example, the precharge voltage may be applied to the non-selection cell string through a common source line. As another example, the precharge voltage may be applied to the non-selection cell string through two lines, e.g., the bit line and the common source line.

In an exemplary embodiment of the inventive concept, during the precharge operation for some cell strings, in particular, a turn-on voltage may be applied to a particular word line and a word line adjacent to the particular word line. The turn-on voltage may be a voltage having a level of no less than a threshold voltage of memory cells connected to the particular word line and the word line adjacent to the particular word line. For example, the precharge control circuit 132 may control the row decoder 140 so that the turn-on voltage is applied to the particular word line and the word line adjacent to the particular word line during the precharge operation for partial cell strings. In an exemplary embodiment of the inventive concept, the threshold voltage of memory cells connected to the particular word lined and the word line adjacent to the particular word line may refer to a threshold voltage increased as the first program operation is performed.

For example, after the first program operation is performed on the particular word line, the first program operation may be performed on the word line adjacent to the particular word line. Then, the second program operation may be performed on the particular word line. In an exemplary embodiment of the inventive concept, in the precharge operation performed before the second program operation for the particular word line, the turn-on voltage may be applied to the particular word line and the word line adjacent to the particular word line.

In an exemplary embodiment of the inventive concept, the particular word line may be a selection word line. The selection word line may be, for example, a word line to which a program voltage is applied. In addition, in an exemplary embodiment of the inventive concept, the word line adjacent to the particular word line may include at least one of a word line arranged on (e.g., above) the selection word line and a word line arranged on (e.g., under) the selection word line.

As a plurality of program steps are adopted to write data of the memory device 100, during the precharge operation performed on the non-selection cell string, the threshold voltage of memory cells connected to a word line adjacent to the selection word line may increase as the first program operation is performed. According to an exemplary embodiment of the inventive concept, during precharge of the non-selection cell string before performing the second program operation, the turn-on voltage may be applied to the selection word line and the word line adjacent to the selection word line. Therefore, since a precharge voltage may be transmitted to a channel of a memory cell connected to the selection word line, during a later program operation, boosting efficiency the non-selection cell string may increase. In addition, the boosting efficiency increases so that program performance may improve.

Figure 2B:
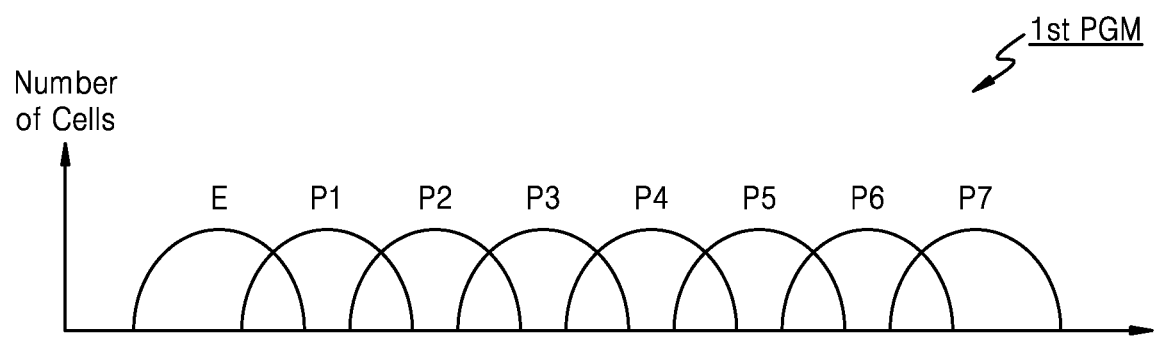
Figure 2C:
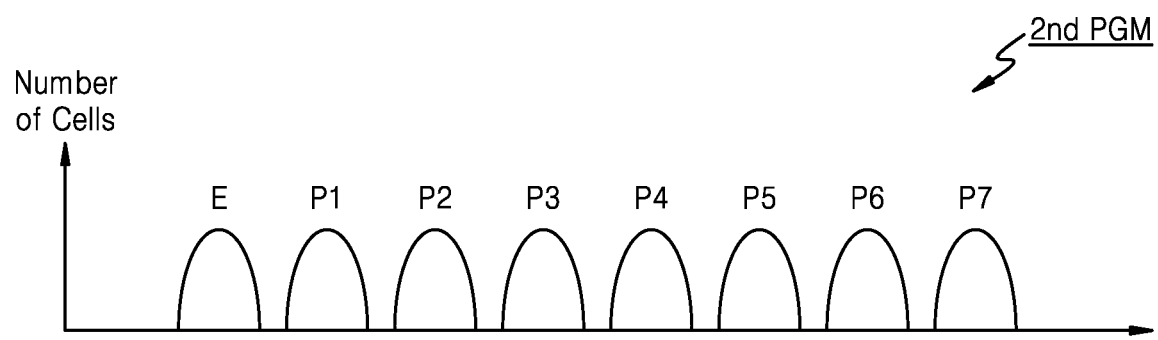

FIGS. 2A to 2C are views illustrating a program operation according to an exemplary embodiment of the inventive concept. In detail, FIG. 2A illustrates a table for describing a performing order of first and second program operations. FIGS. 2B and 2C are graphs illustrating an example of a threshold voltage distribution of a memory cell formed in the first and second program operations.

Referring to FIG. 2A, in the illustrated table, the numbers refer to turns of program operations. For example, a first program operation $1^{st}$ PGM and a second program operation $2^{nd}$ PGM may be performed in the order of the first word line WL[1], the second word line WL[2], and a third word line WL[3] in the same string selection line unit. In addition, the first program operation $1^{st}$ PGM and the second program operation $2^{nd}$ PGM may be performed in the order of from a first string selection line SSL[1] to a fourth string selection line SSL[4] in the same word line. However, the inventive concept is not limited thereto. A performing order of the first to fourth string selection lines SSL[1] to SSL[4] may vary.

According to the present exemplary embodiment, it is illustrated that four string selection lines are included in a program unit, for convenience of description. However, the inventive concept is not limited thereto. A program unit may be, for example, a page unit or a block unit.

In detail, among memory cells connected to the first word line WL[1], the first program operation $1^{st}$ PGM may be performed on memory cells included in cell strings connected to the respective string selection lines in the order of the first string selection line SSL[1] to the fourth string selection line SSL[4]. Then, among memory cells connected to the second word line WL[2], the first program operation $1^{st}$ PGM may be performed on memory cells included in cell strings connected to the respective string selection lines in the order of the first string selection line SSL[1] to the fourth string selection line SSL[4].

After performing the first program operation $1^{st}$ PGM on memory cells connected to the second word line WL[2], the second program operation $2^{nd}$ PGM may be performed on memory cells connected to the first word line WL[1]. For example, among the memory cells connected to the first word line WL[1], the second program operation $2^{nd}$ PGM may be performed on memory cells included in cell strings connected to the respective string selection lines in the order of the first string selection line SSL[1] to the fourth string selection line SSL[4].

Then, the first program operation $1^{st}$ PGM is performed on memory cells connected to the third word line WL[3] and the second program operation $2^{nd}$ PGM may be performed on the memory cells connected to the second word line WL[2]. Hereinafter, the first and second program operations $1^{st}$ PGM and $2^{nd}$ PGM in accordance with the above pattern may be performed on remaining word lines.

Referring to FIG. 2B, a threshold voltage distribution of memory cells connected to the word line on which the first program operation $1^{st}$ PGM is performed is illustrated. According to the present exemplary embodiment, it is illustrated that a memory cell is programmed by a triple-level cell (TLC) method. However, this is only exemplary and the inventive concept is not limited thereto.

As the first program operation $1^{st}$ PGM is performed, memory cells may have eight threshold voltage distributions. For example, together with a threshold voltage distribution of an erase state E, threshold voltage distributions in first to seventh program states P1 through P7 may be formed. Memory cells on which the first program operation $1^{st}$ PGM is performed may have a coarse threshold voltage distribution. For example, distributions in the respective program states may overlap other adjacent distributions. The first program operation $1^{st}$ PGM may be referred to as a pre-program operation.

Referring to FIG. 2C, a threshold voltage distribution of memory cells connected to word lines on which the second program operation $2^{nd}$ PGM is performed is illustrated. The second program operation $2^{nd}$ PGM may form a secondary fine distribution on memory cells on which a primary coarse distribution is formed. In other words, as the second program operation $2^{nd}$ PGM is performed, memory cells may have independent final threshold voltage distributions without an overlapping region. The second program operation $2^{nd}$ PGM may be referred to as a reprogram operation. For example, the pre-program and reprogram operations may be performed in a vertical non-volatile memory structure.

FIG. 3 is a view illustrating a program operation according to an exemplary embodiment of the inventive concept.

Referring to FIG. 3, the first program operation $1^{st}$ PGM and the second program operation $2^{nd}$ PGM may be performed in units of word lines. In detail, after the first program operation $1^{st}$ PGM is performed on the memory cells connected to the first word line WL[1], the first program operation $1^{st}$ PGM may be performed on the memory cells connected to the second word line WL[2]. Then, the second program operation $2^{nd}$ PGM is performed on the memory cells connected to the first word line WL[1]. Then, the first program operation $1^{st}$ PGM may be performed on the memory cells connected to the third word line WL[3]. Then, the second program operation $2^{nd}$ PGM may be performed on the memory cells connected to the second word line WL[2]. Hereinafter, the first and second operations $1^{st}$ PGM and $2^{nd}$ PGM in accordance with the above-described pattern may be performed on the remaining word lines.

The first and second program operations $1^{st}$ PGM and $2^{nd}$ PGM according to the present exemplary embodiment may be referred to as shadow program operations. For example, in accordance with a shadow program operation, in the memory cells on which the first program operation $1^{st}$ PGM is performed, least significant bit (LSB) data is programmed and, in the memory cells on which the second program operation $2^{nd}$ PGM is performed, most significant bit (MSB) data may be programmed. For example, the shadow program operation may be performed in a planar non-volatile memory.

Figure 4:
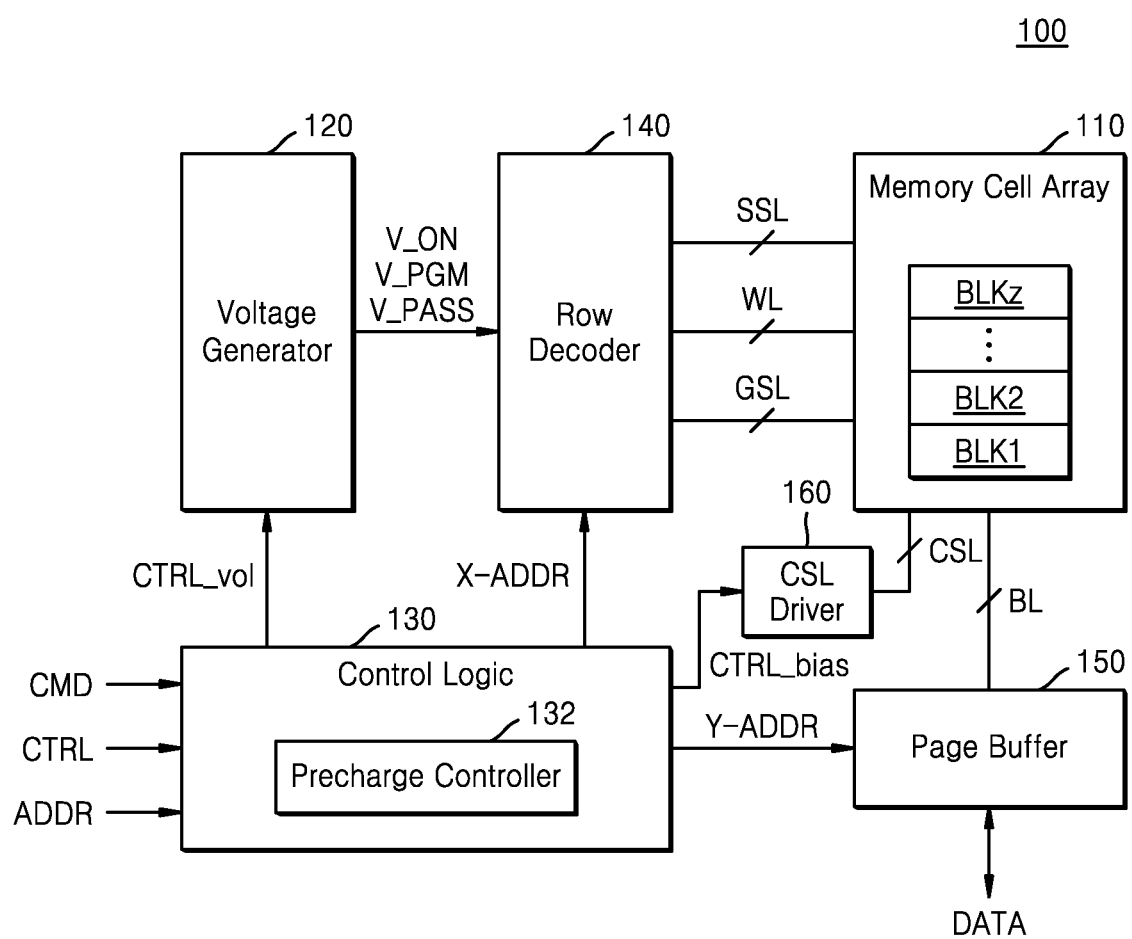
FIG. 4 is a block diagram of a memory device according to an exemplary embodiment of the inventive concept.

FIG. 4 is a block diagram of a memory device according to an exemplary embodiment of the inventive concept. For example, FIG. 4 may illustrate an implementation example of the memory device 100 of FIG. 1.

Referring to FIG. 4, the memory device 100 may include the memory cell array 110, a voltage generator 120, a control logic 130, the row decoder 140, a page buffer 150, and a common source line driver 160. The memory device 100 may further include other various components related to a memory operation such as a data input and output circuit or an input and output interface.

The memory cell array 110 includes a plurality of memory cells and may be connected to word lines WL, string selection lines SSL, ground selection lines GSL, a common source line CSL, and bit lines BL. The memory cell array 110 may be connected to the row decoder 140 through the word lines WL, the string selection lines SSL, and the ground selection lines GSL or may be connected to the page buffer 150 through the bit lines BL. In addition, the memory cell array 110 may be connected to the common source line driver 160 through the common source line CSL.

For example, a plurality of memory cells included in the memory cell array 110 may be non-volatile memory cells that maintain stored data although supplied power is blocked. In detail, when a memory cell is a non-volatile memory cell, the memory device 100 may be an electrically erasable programmable read-only memory (EEPROM), a flash memory, a phase change random access memory (PRAM), a resistance random access memory (RRAM), a nano-floating gate memory (NFGM), a polymer random access memory (PoRAM), a magnetic random access memory (MRAM), or a ferroelectric random access memory (FRAM). Hereinafter, exemplary embodiments are illustrated where the plurality of memory cells are NAND flash memory cells. However, the inventive concept is not limited thereto.

The memory cell array 110 includes a plurality of memory blocks BLK1 to BLKz, and each of the memory blocks BLK1 to BLKz may have a plane structure or a three-dimensional structure. The memory cell array 110 may include at least one of a single level cell block including single level cells (SLC), a multilevel cell block including multilevel cells (MLC), a triple level cell block including triple level cells (TLC), or a quad level cell block including quad level cells. For example, partial memory blocks among the plurality of memory blocks BLK1 to BLKz may be SLC blocks and the other memory blocks may be MLC blocks, TLC blocks, or quad level cell blocks.

The voltage generator 120 may generate various voltages used in the memory device 100. For example, for a program operation, a program voltage V_PGM provided to the selection word line and a pass voltage V_PASS provided to non-selection word lines may be generated. In addition, the voltage generator 120 may further generate a string selection voltage and a ground selection voltage that are respectively provided to the string selection lines SSL and the ground selection lines GSL.

In an exemplary embodiment of the inventive concept, the voltage generator 120 may generate a turn-on voltage V_ON provided to the selection word line and the word line adjacent to the selection word line during the precharge operation. For example, the turn-on voltage V_ON may have a level of no less than a threshold voltage of a memory cell on which the first program operation $1^{st}$ PGM is performed.

The control logic 130 may output various internal control signals for programming data to the memory cell array 110 or reading data from the memory cell array 110 based on the command signal CMD, the address signal ADDR, and the control signal CTRL. For example, the control logic 130 may output a voltage control signal CTRL_vol for controlling levels of various voltages generated by the voltage generator 120. In addition, the control logic 130 may output a control signal CTRL_bias for controlling driving for the common source line CSL of the common source line driver 160.

The control logic 130 may provide a row address signal X-ADDR to the row decoder 140 and may provide a column address Y-ADDR to the page buffer 150. The row decoder 140 may select at least one of word lines of a memory block selected in response to the row address signal X-ADDR. During a program operation, the row decoder 140 may provide the program voltage V_PGM to a word line of a selection memory cell and may provide a pass voltage V_PASS to word lines of non-selection memory cells in response to the row address signal X-ADDR. The page buffer 150 may operate as a write driver or a sense amplifier. During the program operation, the page buffer 150 operates as a write driver and may apply a voltage, in accordance with data DATA to be stored in the memory cell array 110, to the bit lines BL. On the other hand, during a read operation, the page buffer 150 operates as a sense amplifier and may sense data DATA stored in the memory cell array 110.

The control logic 130 may control the voltage generator 120, the row decoder 140, the page buffer 150, and the common source line driver 160 so that a plurality of data program steps are performed on the memory cell array 110. The control logic 130 may control the first program operation $1^{st}$ PGM and the second program operation $2^{nd}$ PGM for the memory cell array 110, which is only exemplary. For example, a program step may include first to third program operations or more program operations.

The control logic 130 may include the precharge control circuit 132. However, the inventive concept is not limited thereto. For example, the precharge control circuit 132 may be provided outside the control logic 130.

The precharge control circuit 132 may control the voltage generator 120, the row decoder 140, the page buffer 150, and the common source line driver 160 so that precharge is performed on partial cell strings. For example, partial cell strings on which precharge is performed may be non-selection cell strings. The precharge control circuit 132 controls a precharge operation to be performed on a non-selection cell string before performing the first program operation $1^{st}$ PGM and the second program operation $2^{nd}$ PGM so that, during a subsequent program, boosting efficiency of a non-selection cell string may be improved.

According to an exemplary embodiment of the inventive concept, the precharge control circuit 132 may control the row decoder 140 so that the turn-on voltage V_ON is applied to the selection word line and a word line adjacent to the selection word line, among the plurality of word lines WL, during precharge for the second program operation $2^{nd}$ PGM. Therefore, during precharge for the non-selection cell string, memory cells on which the first program operation 1st PGM is performed are turned on and a channel may be formed.

In an exemplary embodiment of the inventive concept, the word line adjacent to the selection word line may include a word line arranged on (e.g., above) the selection word line or the word line adjacent to the selection word line may include a word line arranged on (e.g., under) the selection word line. For example, for the word line arranged above the selection word line, the selection word line may be between a substrate and the word line arranged above the selection word line. For example, for the word line arranged under the selection word line, the word line arranged under the selection word line may be between the substrate and the selection word line.

For example, before the first program operation $1^{st}$ PGM is performed on memory cells connected to the selection word line and the word line adjacent to the selection word line, a first voltage is applied to the selection word line and the word line adjacent to the selection word line so that the non-selection cell string may be precharged. In addition, after the first program operation $1^{st}$ PGM is performed on memory cells connected to the selection word line and the word line adjacent to the selection word line, and before the second program operation $2^{nd}$ PGM is performed, a second voltage is applied to the selection word line and the word line adjacent to the selection word line so that the non-selection cell string may be precharged. In an exemplary embodiment of the inventive concept, the first voltage and the second voltage may have different levels. For example, the second voltage may have a higher level than the first voltage.

During the precharge operation, a precharge voltage may be applied to the non-selection cell string through at least one of the bit line BL and the common source line CSL. For example, the precharge control circuit 132 may control the page buffer 150 so that the precharge voltage is applied to the non-selection cell string through the bit line BL. As another example, the precharge control circuit 132 may control the common source line driver 160 so that the precharge voltage is applied to the non-selection cell string through the common source line CSL. As another example, the precharge control circuit 132 may control the page buffer 150 and the common source line driver 160 so that the precharge voltage is applied to the non-selection cell string through both the bit line BL and the common source line CSL.

Figure 5:
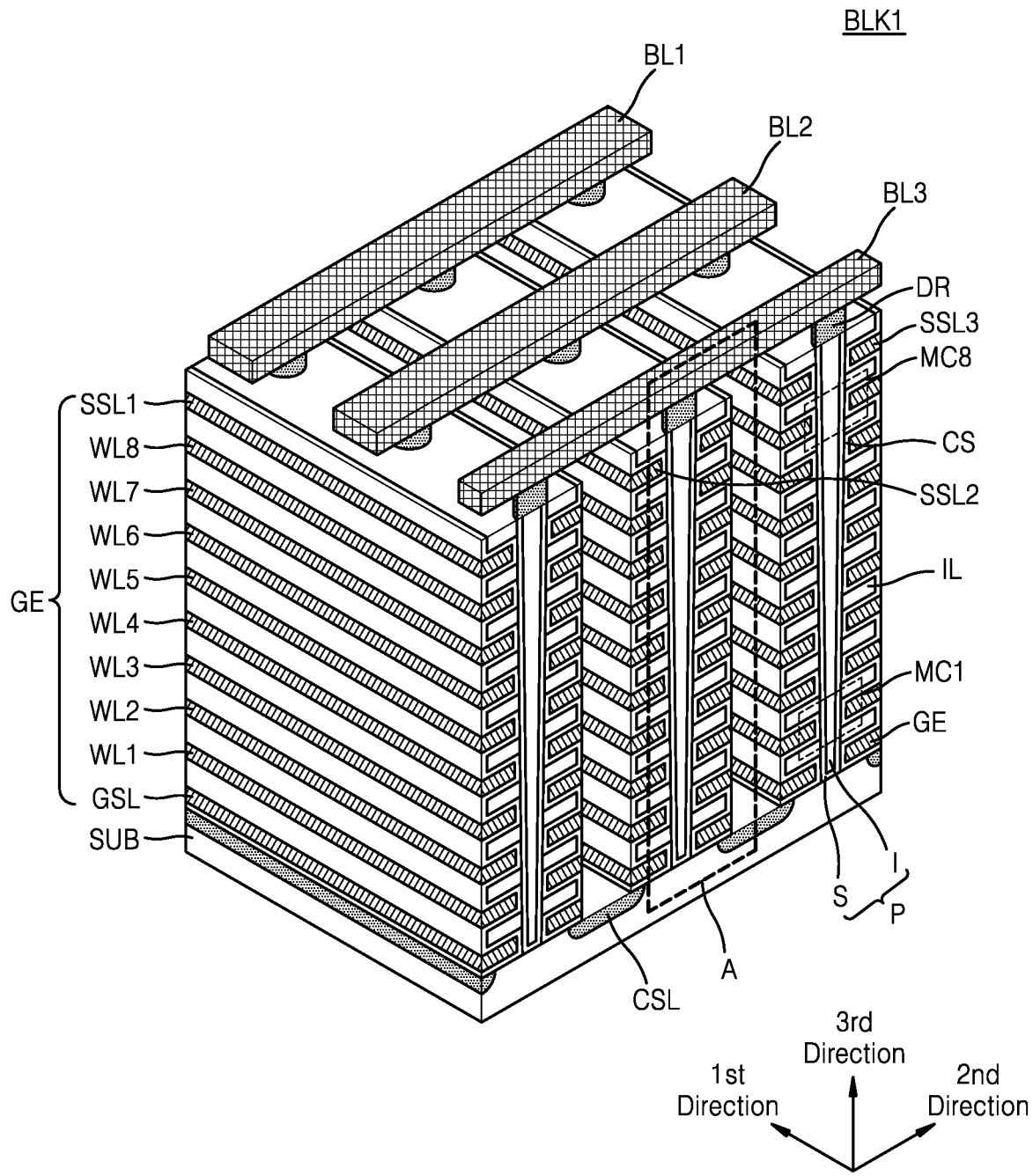
FIG. 5 is a perspective view illustrating a first memory block among memory blocks of FIG. 4 according to an exemplary embodiment of the inventive concept.

FIG. 5 is a perspective view illustrating a first memory block among memory blocks of FIG. 4 according to an exemplary embodiment of the inventive concept.

Referring to FIG. 5, the first memory block BLK1 may be formed in a direction perpendicular to a substrate SUB. A plurality of memory cells (e.g., MC1 through MC8) may be formed in the first memory block BLK1. In FIG. 5, it is illustrated that the first memory block BLK1 includes four selection lines GSL and SSL1 to SSL3, eight word lines WL1 to WL8, and three bit lines BL1 to BL3. However, more or less lines may be included. In another example, the first memory block BLK1 may include one or more dummy word lines between the first word line WL1 and the ground selection line GSL and/or the eighth word line WL8 and the string selection lines SSL1 to SSL3.

The substrate SUB may be a polysilicon layer doped with a first conductivity type (for example, p-type). The substrate SUB may be a bulk silicon substrate, a silicon-on-insulator (SOI) substrate, a germanium substrate, or a substrate of an epitaxial thin film obtained by performing selective epitaxial growth (SEG). The substrate SUB may be formed of a semiconductor material, for example, silicon (Si), germanium (Ge), silicon germanium (SiGe), gallium arsenic (GaAs), indium gallium arsenic (InGaAs), aluminium gallium arsenic (AlGaAs), or at least one combination of the above metals.

In the substrate SUB, the common source lines CSL extending on the substrate SUB in a first direction and doped with second conductivity type (for example, n-type) impurities may be provided. On a region of the substrate SUB between two adjacent common source lines CSL, a plurality of insulating layers IL that extend in the first direction are sequentially provided in a third direction. The plurality of insulating layers IL may be separated by a particular distance in the third direction. For example, the plurality of insulating layers IL may include an insulating material such as a silicon oxide.

On the region of the substrate SUB between the two adjacent source lines CSL, a plurality of pillars P that are sequentially arranged in the first direction and that pass through the plurality of insulating layers IL in the third direction may be provided. For example, the plurality of pillars P may contact the substrate SUB through the plurality of insulating layers IL. In detail, a surface layer S of each pillar P may include a silicon material doped with the first conductivity type and may function as a channel region. On the other hand, an internal layer I of each pillar P may include an insulating material such as a silicon oxide or air gap.

In a region between the two adjacent common source lines CSL, a charge storage layer CS may be provided along exposed surfaces of the insulating layers IL, the pillars P, and the substrate SUB. The charge storage layer CS may include a gate insulating layer (referred to as 'a tunneling insulating layer'), a charge trap layer, and a blocking insulating layer. For example, the charge storage layer CS may have an oxide-nitride-oxide (ONO) structure. In addition, in a region between the two adjacent common source lines CSL, on the exposed surface of the charge storage layer CS, gate electrodes GE such as selection lines GSL and SSL and word lines WL1 through WL8 may be provided.

Drains or drain contacts DR may be provided on each of the plurality of pillars P. For example, the drains or drain contacts DR may include a silicon material doped with impurities having the second conductivity type. On the drain contacts DR, the bit lines BL1 to BL3 arranged to extend in a second direction and to be separated by a particular distance in the first direction.

Figure 6:
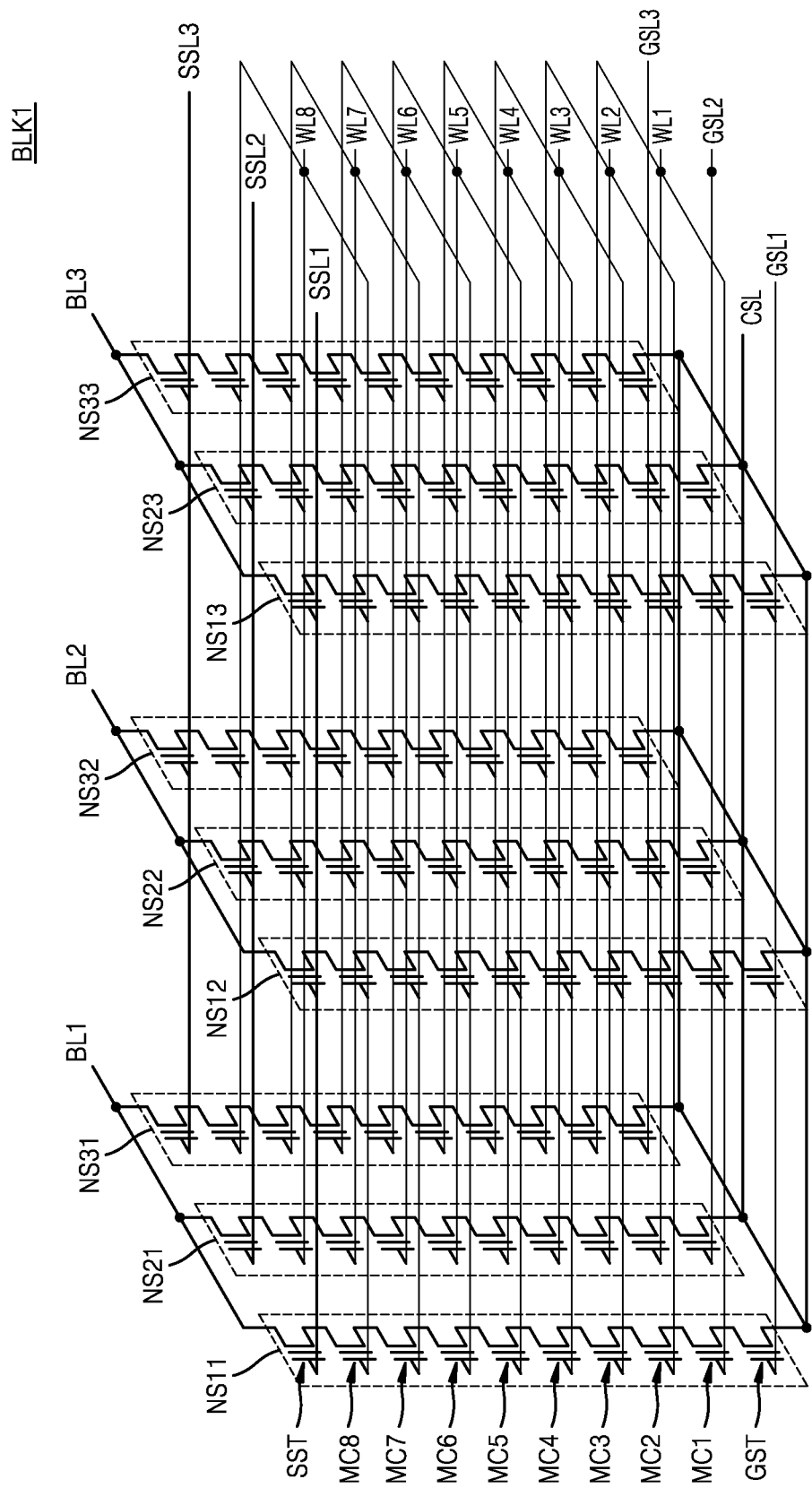
FIG. 6 is a circuit diagram illustrating an equivalent circuit of the first memory block among the memory blocks of FIG. 4 according to an exemplary embodiment of the inventive concept.

FIG. 6 is a circuit diagram illustrating an equivalent circuit of the first memory block among the memory blocks of FIG. 4 according to an exemplary embodiment of the inventive concept.

Referring to FIG. 6, the first memory block BLK1 may be a NAND flash memory having a perpendicular structure, and the memory blocks BLK1 and BLKz illustrated in FIG. 4 may be implemented as illustrated in FIG. 6. The first memory block BLK1 may include a plurality of NAND cell strings NS11 to NS33, the plurality of word lines WL1 to WL8, the plurality of bit lines BL1 to BL3, a plurality of ground selection lines GSL1 to GSL3, the plurality of string selection lines SSL1 to SSL3, and the common source line CSL. Here, the number of NAND cell strings, the number of word lines, the number of bit lines, the number of ground selection lines, and the number of string selection lines may vary in accordance with exemplary embodiments of the inventive concept.

The NAND cell strings NS11, NS21, and NS31 are provided between a first bit line BL1 and the common source line CSL. The NAND cell strings NS12, NS22, and NS32 are provided between a second bit line BL2 and the common source line CSL. The NAND cell strings NS13, NS23, and NS33 are provided between a third bit line BL3 and the common source line CSL. Each NAND cell string (for example, NS11) may include a string selection transistor SST, the plurality of memory cells MC1 through MC8, and a ground selection transistor GST.

NAND cell strings commonly connected to one bit line may configure one column. For example, the NAND cell strings NS11, NS21, and N31 commonly connected to the first bit line BL1 correspond to a first column, the NAND cell strings NS12, NS22, and NS32 commonly connected to the second bit line BL2 correspond to a second column, and the NAND cell strings NS13, NS23, and NS33 commonly connected to the third bit line BL3 may correspond to a third column.

NAND cell strings connected to one string selection line may configure one row. For example, the NAND cell strings NS11, NS12, and NS13 connected to the first string selection line SSL1 correspond to a first row, the NAND cell strings NS21, NS22, and NS23 connected to the second string selection line SSL2 correspond to a second row, and the NAND cell strings NS31, NS32, and NS33 connected to the third string selection line SSL3 may correspond to a third row.

The string selection transistor SST of each NAND cell string may be connected to a corresponding one of the string selection lines SSL1 to SSL3. The plurality of memory cells MC1 to MC8 may be respectively connected to the corresponding word lines WL1 to WL8. The ground selection transistor GST of each NAND cell string are connected to a corresponding one of the ground selection lines GSL1 to GLS3. The string selection transistors SST may be connected to corresponding bit lines BL1 to BL3. The ground selection transistors GST may be connected to the common source line CSL.

According to the present exemplary embodiment, word lines (for example, WL1) having substantially the same height are commonly connected, the string selection lines SSL1 to SSL3 are separate from one another, and the ground selection lines GSL1 to GSL3 are separate from one another. For example, when the memory cells included in the NAND cell strings NS11, NS12, and NS13 connected to the first word line WL1 and corresponding to the first column are programmed, the first word line WL1 and the first string selection line SSL1 are selected. However, the inventive concept is not limited thereto. According to an exemplary embodiment of the inventive concept, the ground selection lines GSL1 to GSL3 may be commonly connected.

Figure 7:
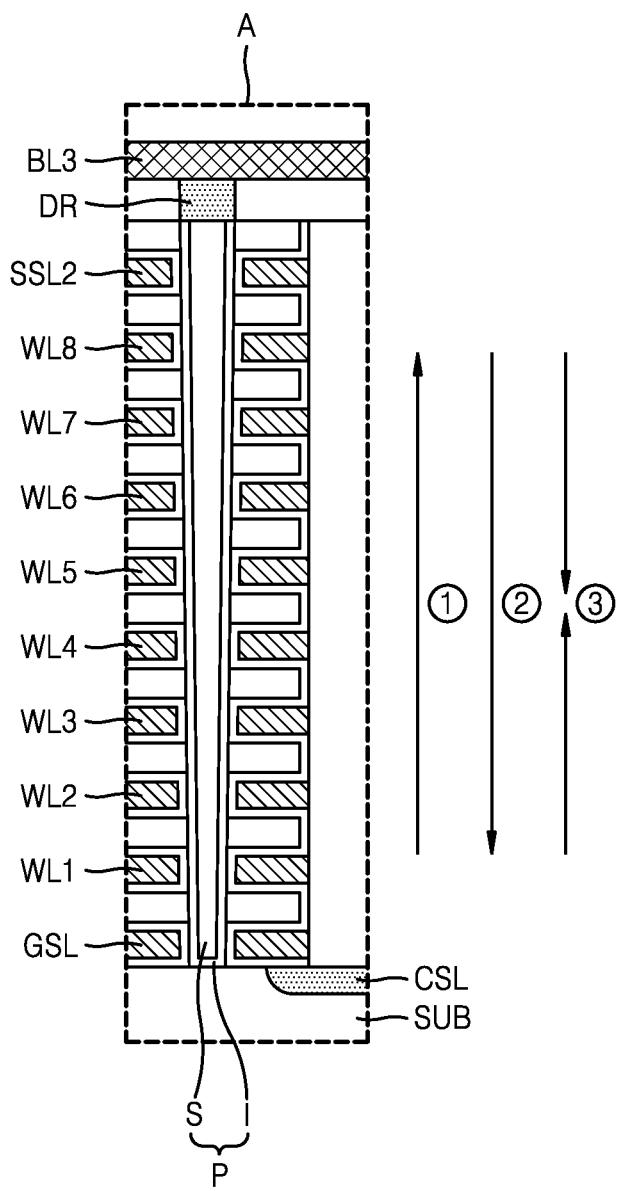
FIG. 7 illustrates a portion of a cross-section of the first memory block of FIG. 5 according to an exemplary embodiment of the inventive concept.

FIG. 7 illustrates a portion of a cross-section of the first memory block of FIG. 5 according to an exemplary embodiment of the inventive concept. FIG. 7 may illustrate, for example, a region A of FIG. 5.

Referring to FIG. 7, various precharge directions for an arbitrary cell string are illustrated. For example, a precharge operation may be performed on a cell string in a direction from the common source line CSL (①). In other words, during the precharge operation, the precharge voltage may be applied to the cell string through the common source line CSL.

According to another example, the precharge operation may be performed on the cell string in a direction from the bit line BL3 (②). In other words, during the precharge operation, the precharge voltage may be applied to the cell string through the bit line BL3.

As another example, the precharge operation may be performed on the cell string in two directions from the common source line CSL and the bit line BL3 (③). In other words, during the precharge operation, the precharge voltage may be applied to the cell string through the two lines of the common source line CSL and the bit line BL3.

FIG. 8 is a flowchart illustrating a method of operating a memory device, according to an exemplary embodiment of the inventive concept. The memory device may include a memory cell array including the plurality of cell strings including the plurality of memory cells, the plurality of word lines connected to the memory cells, the bit lines connected to one side of the cell strings, and the common source line connected to the other side of the cell strings.

Referring to FIG. 8, in performing a data program operation having a plurality of steps on the memory cell array, the first program operation may be performed on the memory cells connected to the first word line (e.g., the selection word line) in operation S100. In addition, the first program operation may be performed on the memory cells connected to the second word line in operation S110. For example, through the first program operation, the memory cells connected to the first word line and the second word line may form a coarse distribution.

Then, the turn-on voltage at a first level is applied to the first and second word lines and the precharge operation may be performed on partial cell strings in operation S120. In operation S120, a voltage at a level lower than the first level may be applied to the third word line among the plurality of word lines. For example, the third word line may be a non-selection word line. In addition, the third word line may not be adjacent to the selection word line.

In an exemplary embodiment of the inventive concept, the first and second word lines may be respectively the selection word line and the word line adjacent to the selection word line. In addition, the turn-on voltage may have a level of no less than the threshold voltage of the memory cell on which the first program operation is performed. In addition, partial cell strings on which the precharge operation is performed may be the non-selection cell strings. Then, the second program operation may be performed on the memory cells connected to the first word line in operation S130.

FIG. 9 is a flowchart illustrating a method of operating a memory device, according to an exemplary embodiment of the inventive concept.

Referring to FIG. 9, the first voltage is applied to the first and second word lines and the non-selection cell string may be precharged in operation S200. For example, in operation S200, the precharge for performing the first program operation may be performed. Then, the first program operation may be performed on the memory cells connected to the first and second word lines in operation S210.

The second voltage having a level different from that of the first voltage may be applied to the first and second word lines and the non-selection cell string may be precharged in operation S220. For example, in operation S220, the precharge for performing the second program operation may be performed. In an exemplary embodiment of the inventive concept, the second voltage may have a level higher than that of the first voltage. The second voltage may be the turn-on voltage for the memory cells on which the first program operation is performed.

Figure 10A:
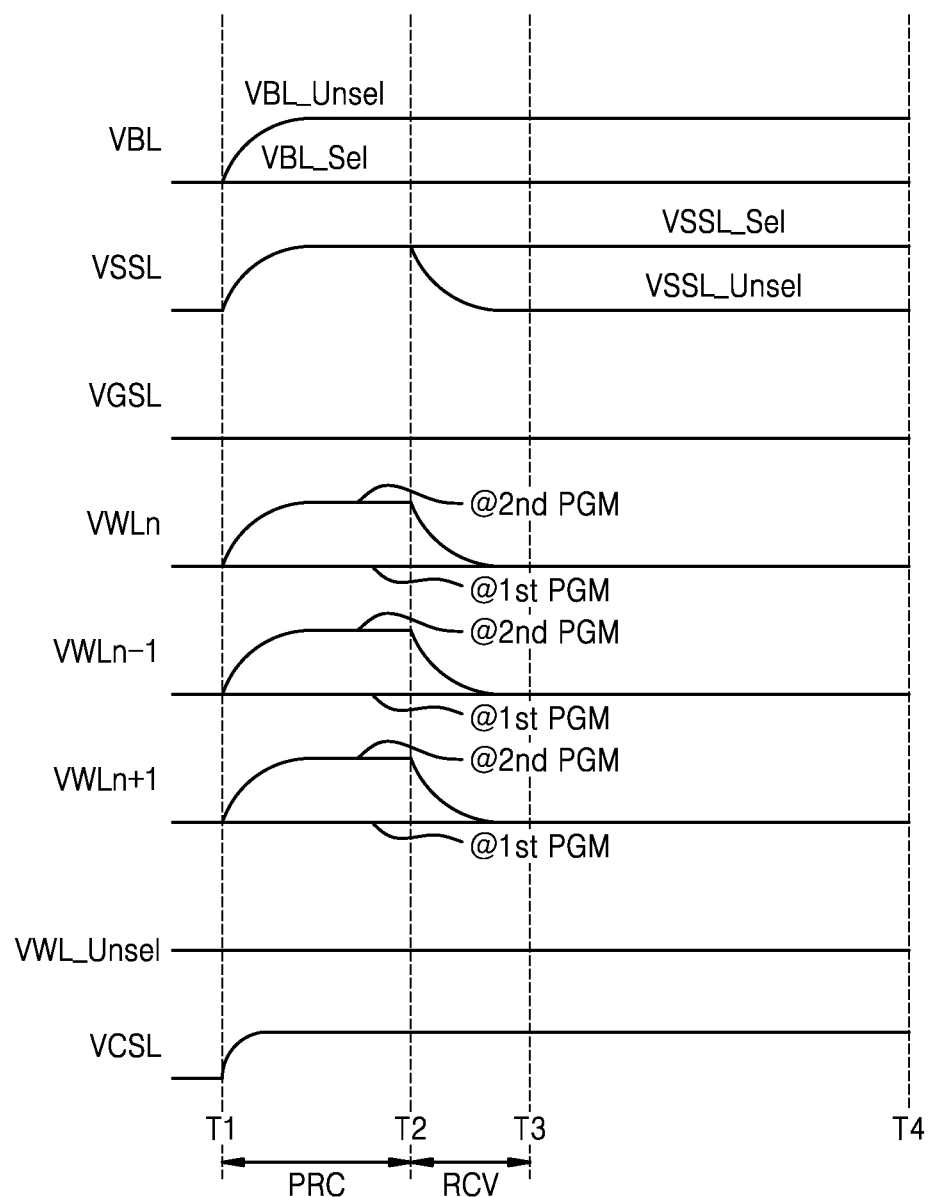
FIGS. 10A and 10B are timing diagrams illustrating a method of operating a memory device, according to exemplary embodiments of the inventive concept.
Figure 10B:
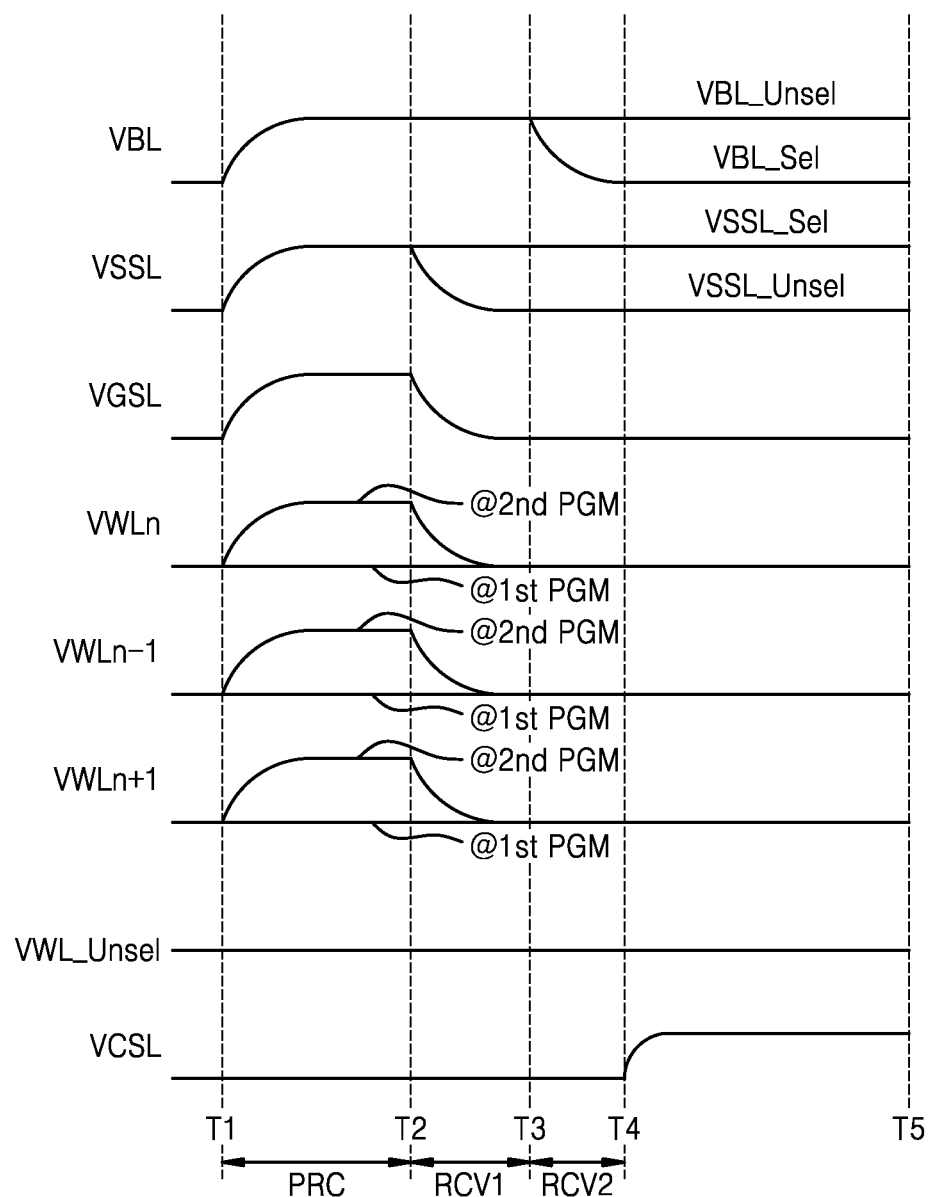

FIGS. 10A and 10B are timing diagrams illustrating a method of operating a memory device, according to exemplary embodiments of the inventive concept. For example, FIGS. 10A and 10B may be timing diagrams of a case in which precharge is performed from a bit line direction.

Referring to FIG. 10A, a period from first time T1 to second time T2 may be a precharge period PRC and a period from the second time T2 to third time T3 may be a recovery period RCV. In the precharge period PRC, a voltage (e.g., VSSL_Unsel) applied to a non-selection string selection line SSL_Unsel increases so that a string selection transistor (for example, SST of FIG. 6) connected to the non-selection string selection line SSL_Unsel may be turned on. In an exemplary embodiment of the inventive concept, in the precharge period PRC, the precharge voltage may be applied to the non-selection string selection line SSL_Unsel. Therefore, the precharge voltage may be applied to the non-selection cell string through the non-selection string selection line SSL_Unsel. The precharge period PRC may be a precharge period @ $1^{st}$ PGM for performing the first program operation $1^{st}$ PGM or may be a precharge period @$2^{nd}$ PGM for performing the second program operation $2^{nd}$ PGM. For example, in the precharge period @$1^{st}$ PGM for performing the first program operation $1^{st}$ PGM, the first voltage (e.g., VWLn, VWLn−1, and VLWn+1) may be applied to an nth word line WLn (where n is a natural number) and word lines Wn−1 and WLn+1 adjacent to the nth word line WLn. In addition, in the precharge period @$2^{nd}$ PGM for performing the second program operation $2^{nd}$ PGM, the second voltage at a level higher than that of the first voltage may be applied to the nth word line WLn and the word lines WLn−1 and WLn+1 adjacent to the nth word line WLn. For example, the nth word line WLn may be a selection word line.

In an exemplary embodiment of the inventive concept, in the precharge period @$2^{nd}$ PGM for performing the second program operation $2^{nd}$ PGM, the turn-on voltage may be applied to the nth word line WLn and the word lines WLn−1 and VWLn+1 adjacent to the nth word line WLn. Therefore, in the precharge period PRC, memory cells connected to the (n−1)th to (n+1)th word lines WLn−1 to WLn+1 among the memory cells included in the non-selection cell string may be turned on.

In an exemplary embodiment of the inventive concept, a ground voltage (e.g., VWL_Unsel) may be applied to word lines WL_Unsel other than the (n−1)th to (n+1)th word lines VWLn−1 to WLn+1. Therefore, boosting efficiency of the non-selection cell string may be improved.

For example, in the precharge period PRC, a voltage (e.g., VCSL) applied to the common source line CSL may increase. Therefore, a phenomenon in which electrons leave from the boosted cell strings to the common source line CSL may be prevented. However, the inventive concept is not limited thereto.

In the recovery period RCV, the voltage applied to the non-selection string selection line SSL_Unsel may be recovered to a level before the increase (e.g., a level of VSSL_Sel). In addition, in the recovery period RCV, the voltage applied to the (n−1)th to (n+1)th word lines WLn−1 to WLn+1 may be recovered to a level before the increase.

Referring to FIG. 10B, the period from the first time T1 to the second time T2 may be referred to as the precharge period PRC, the period from the second time T2 to the third time T3 may be referred to as a first recovery period RCV1, and a period from the third time T3 to fourth time T4 may be referred to as a second recovery period RCV2.

The timing diagram of FIG. 10B is similar to the timing diagram of FIG. 10A. According to the present exemplary embodiment, in the precharge period PRC, all the voltages (e.g., VBL_Sel and VBL_Unsel) applied to the selection bit line BL_Sel and the non-selection bit line BL_Unsel increase, and, in the second recovery period RCV2, the voltage applied to the selection bit line BL_Sel may be recovered to a level before the increase. In addition, in the precharge period PRC, the voltage (e.g., VGSL) applied to the ground selection line GSL increases and the voltage (e.g., VCSL) applied to the common source line CSL does not increase but is maintained. The voltage applied to the common source line CSL may increase at the fourth time T4 after the second recovery period RCV2.

Figure 11:
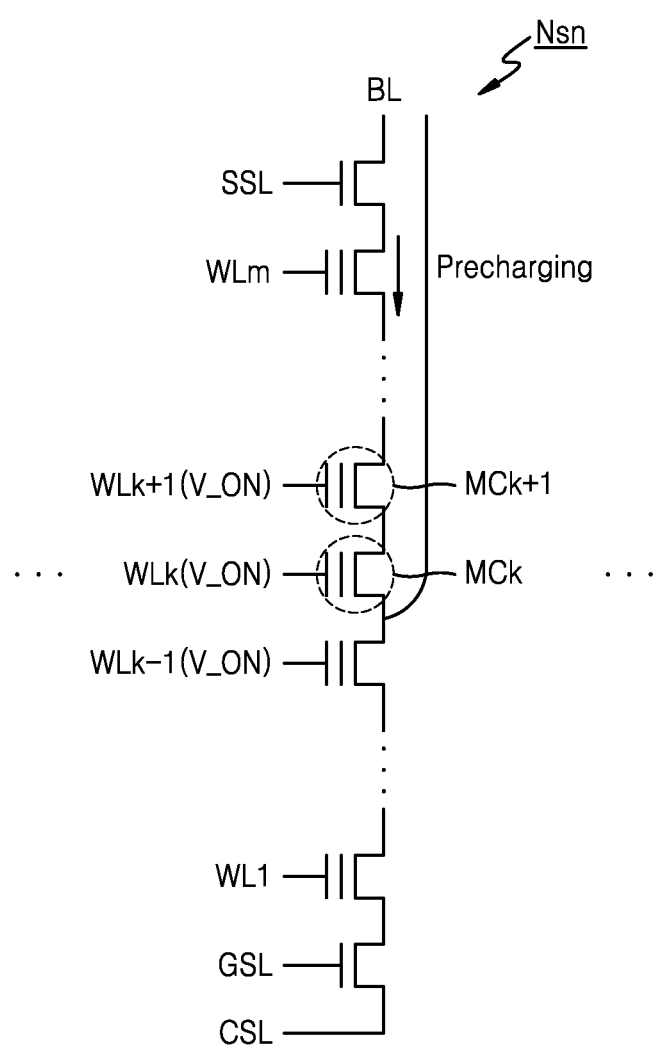
FIG. 11 is a view illustrating a cell string during precharge according to an exemplary embodiment of the inventive concept.

FIG. 11 is a view illustrating a cell string during precharge according to an exemplary embodiment of the inventive concept. FIG. 11 may illustrate an example of a cell string NSn in the precharge period PRC before the first program operation $1^{st}$ PGM and the second program operation $2^{nd}$ PGM are performed.

Referring to FIG. 11, the precharge voltage may be applied to the cell string NSn though the bit line BL. In the cell string Nsn, the first program operation $1^{st}$ PGM may be already performed on a (k+1)th memory cell MCk+1 and a kth memory cell MCk. In other words, threshold voltages of the (k+1)th memory cell MCk+1 and the kth memory cell MCk may already increase before performing the first program operation $1^{st}$ PGM.

For example, the kth word line WLk may be the selection word line on which the second program operation $2^{nd}$ PGM is to be performed. In an exemplary embodiment of the inventive concept, in the precharge period PRC, the turn-on voltage V_ON may be applied to the (k−1)th to (k+1)th word lines WLk−1 to WLk+1. Therefore, since, in the precharge period PRC for the second program operation $2^{nd}$ PGM, the word line adjacent to the selection word line is turned on and may form a channel, the precharge voltage may reach the memory cell connected to the selection word line. During a subsequent program operation, the boosting efficiency of the non-selection cell string may increase.

For example, the first and second program operations $1^{st}$ PGM and $2^{nd}$ PGM may be already performed on the (k−1)th memory cell MCk−1. As the turn-one voltage V_ON is applied to the (k−1)th word line WLk−1 connected to the (k−1)th memory cell MCk−1, subsequently, during the program operation performed on the kth memory cell MCk, a hot carrier injection phenomenon may be prevented from occurring.

Figure 12A:
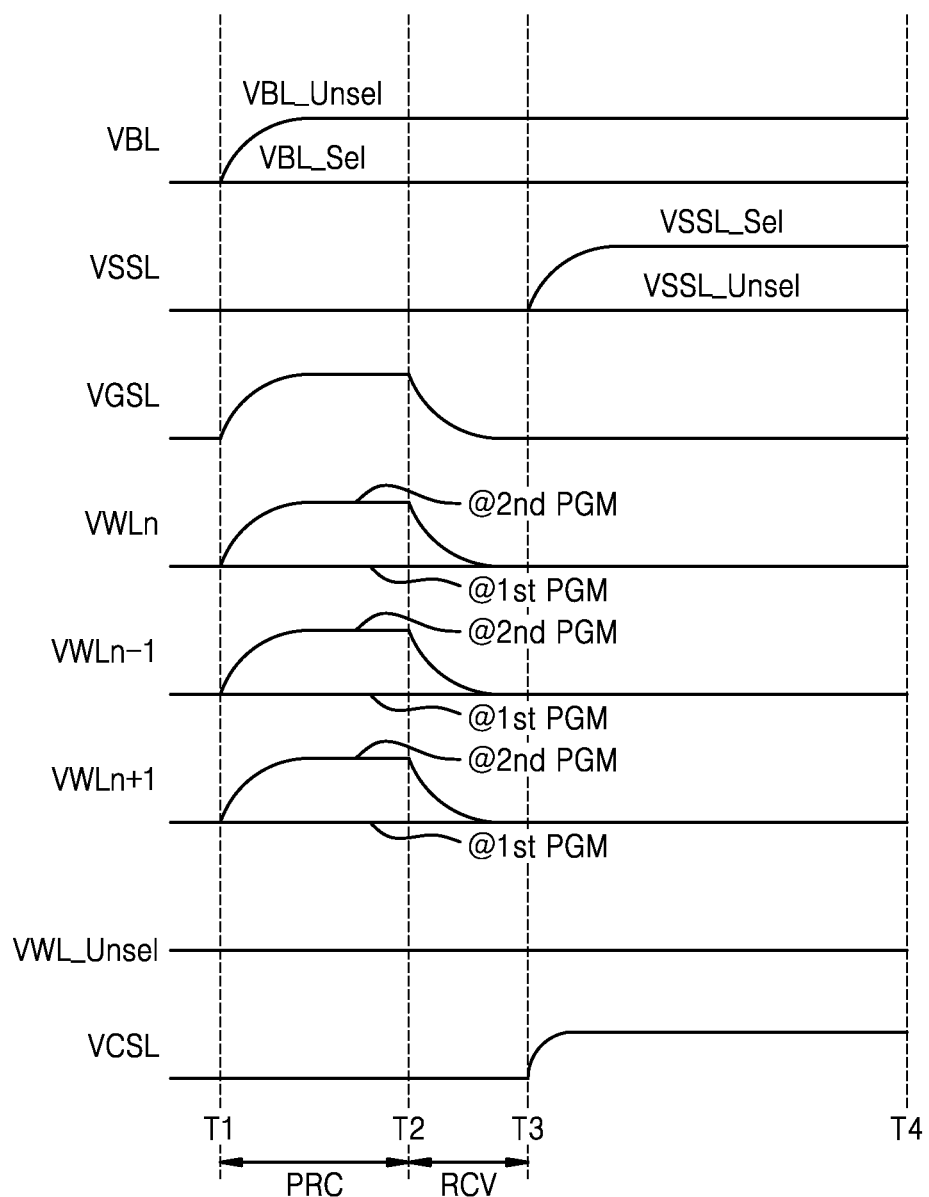
FIGS. 12A and 12B are timing diagrams illustrating a method of operating a memory device, according to exemplary embodiments of the inventive concept.
Figure 12B:
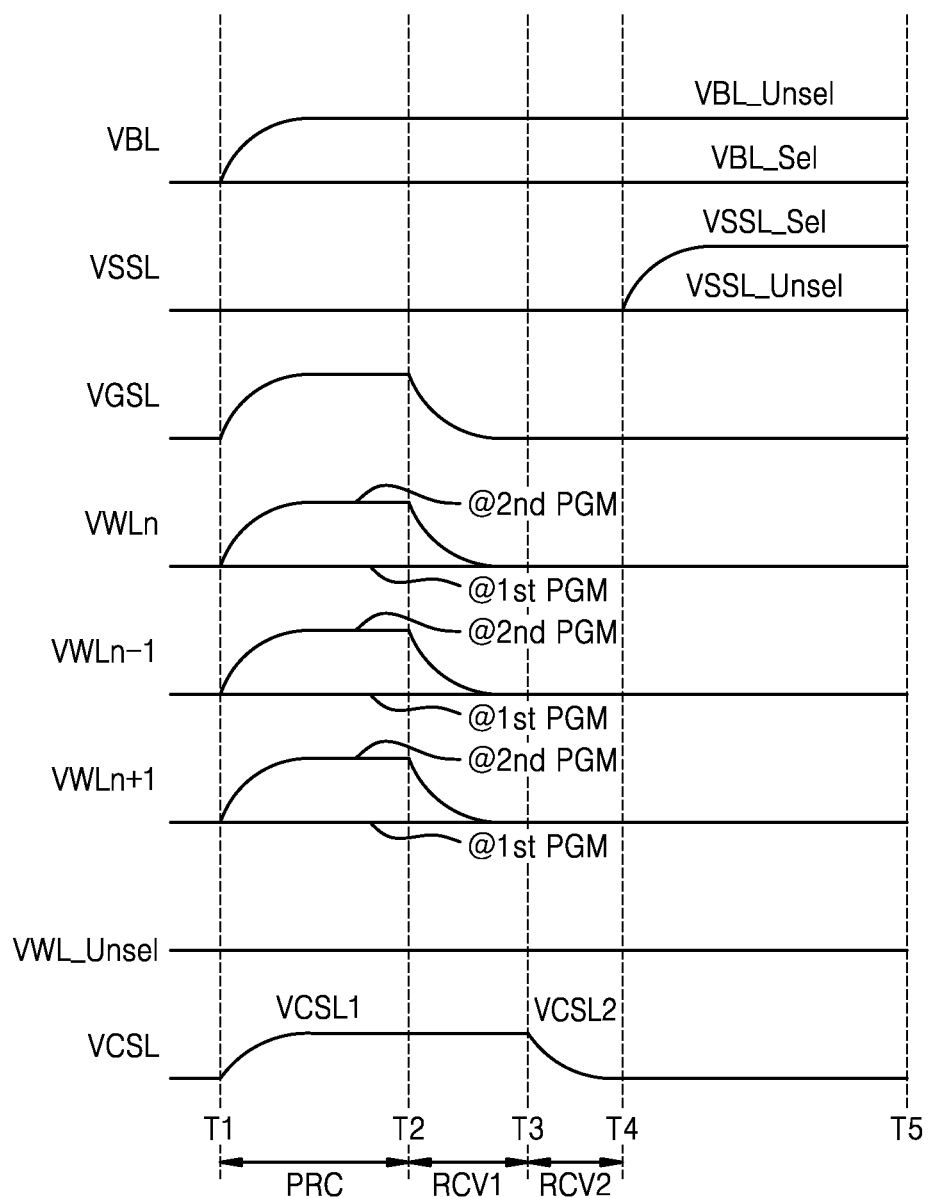

FIGS. 12A and 12B are timing diagrams illustrating a method of operating a memory device, according to exemplary embodiments of the inventive concept. For example, FIGS. 12A and 12B may be timing diagrams where precharge is performed from the common source line direction.

The timing diagram of FIG. 12A is similar to the timing diagram of FIG. 10A. According to the present exemplary embodiment, in the precharge period PRC, the voltage (e.g., VSSL) applied to the string selection line SSL may not increase but may be maintained, and the voltage (e.g., VGSL) applied to the ground selection line GSL may increase. Therefore, the precharge voltage may be applied to the non-selection cell string through the common source line CSL. For example, in the precharge period PRC, the voltage (e.g., VCSL) applied to the common source line CSL may not increase but may be maintained. For example, in the precharge period PRC, the voltage applied to the common source line CSL may be maintained as a ground voltage. Therefore, the non-selection cell string may be precharged to the ground voltage.

The timing diagram of FIG. 12B is similar to the timing diagram of FIG. 12A. In the timing diagram of FIG. 12B, the precharge period PRC, the first recovery period RCV1, and the second recovery period RCV2 may be provided.

According to the present exemplary embodiment, in the precharge period PRC, the voltage (e.g., VCSL) applied to the common source line CSL may increase. For example, in the precharge period PRC, the voltage applied to the common source line CSL may be a voltage VCSL1 at a level higher than that of the ground voltage. In addition, in the second recovery period RCV2, the voltage applied to the common source line CSL may be recovered to a voltage VCSL2 at a level higher than that before the increase.

FIGS. 13A to 13D are timing diagrams illustrating a method of operating a memory device according to exemplary embodiments of the inventive concept. For example, FIGS. 13A to 13B may be timing diagrams of a case in which precharge is performed from two directions of the bit line and the common source line.

Figure 13A:
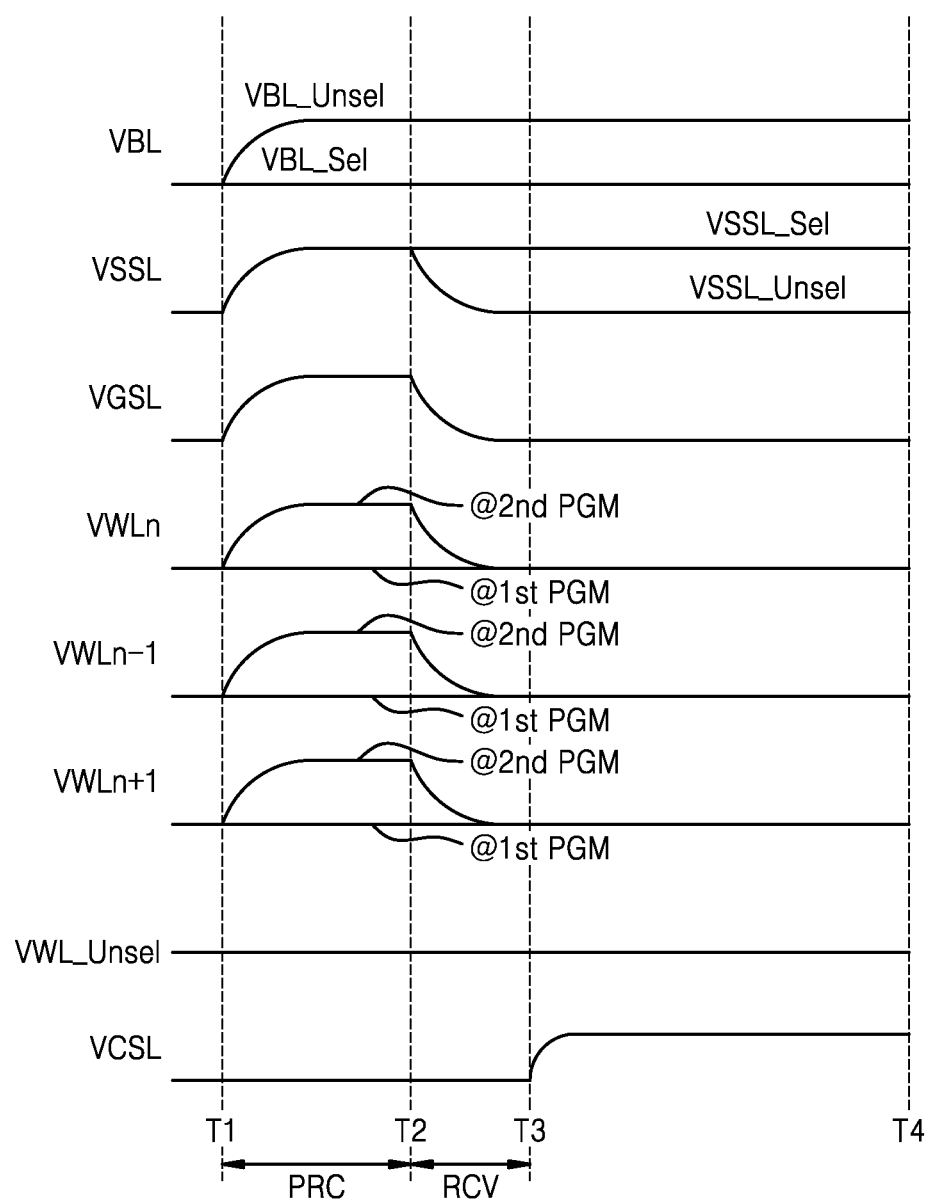
FIGS. 13A to 13D are timing diagrams illustrating a method of operating a memory device, according to exemplary embodiments of the inventive concept.

The timing diagram of FIG. 13A is similar to the timing diagram of FIG. 10A. According to the present exemplary embodiment, in the precharge period PRC, the voltage (e.g., VGSL) applied to the ground selection line GSL may increase. In addition, in the precharge period PRC and the recovery period RCV, the voltage (e.g., VCSL) applied to the common source line CSL does not increase but may be maintained.

Figure 13B:
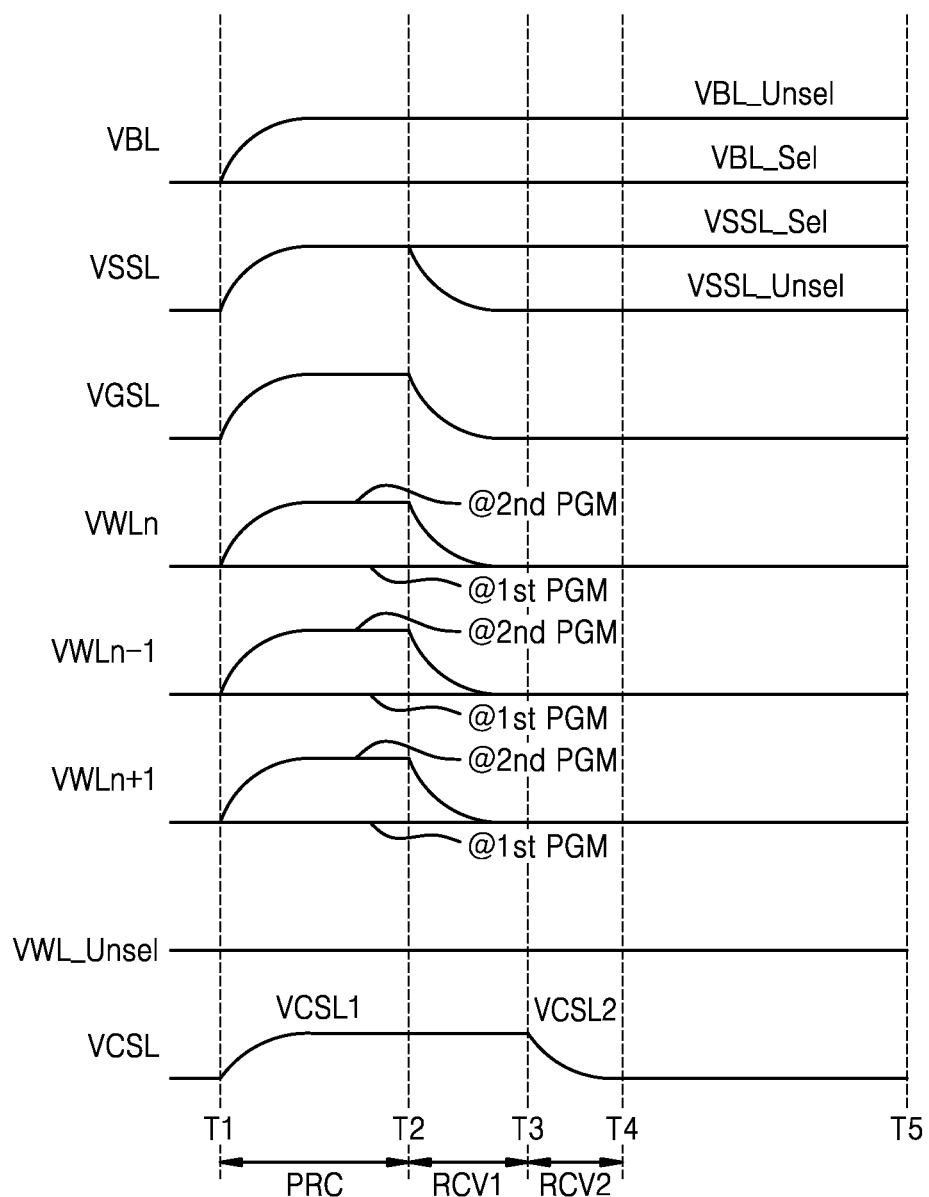

The timing diagram of FIG. 13B is similar to the timing diagram of FIG. 13A. In the timing diagram of FIG. 13B, the precharge period PRC, the first recovery period RCV1, and the second recovery period RCV2 may be provided.

According to the present exemplary embodiment, in the precharge period PRC, the voltage (e.g., VCSL) applied to the common source line CSL may increase. For example, in the precharge period PRC, the voltage applied to the common source line CSL may be the voltage VCSL1 at the level higher than that of the ground voltage. In addition, in the second recovery period RCV2, the voltage applied to the common source line CSL may be recovered to the voltage VCSL2 at a level higher than that before the increase.

Figure 13C:
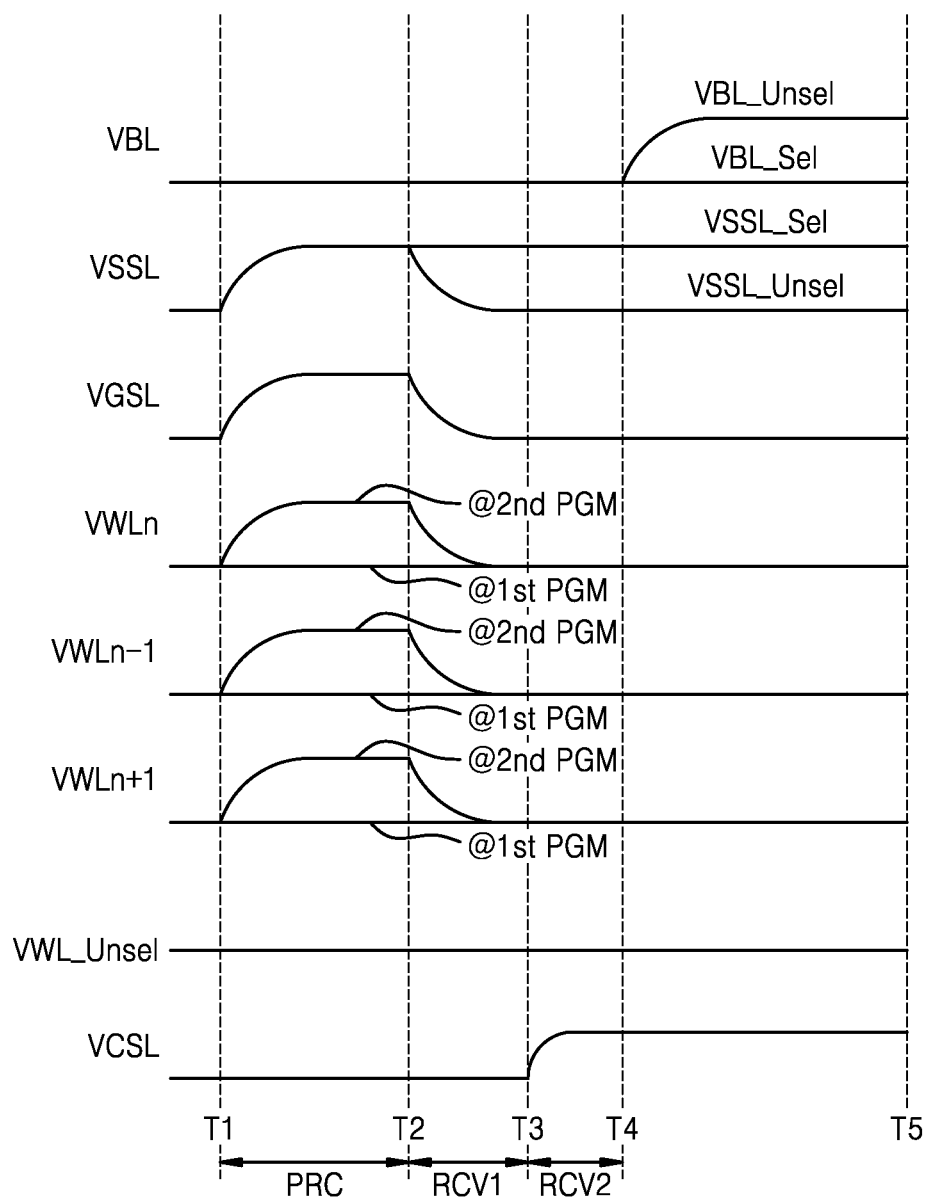

The timing diagram of FIG. 13C is similar to the timing diagram of FIG. 10B. According to the present exemplary embodiment, in the precharge period PRC, the first recovery period RCV1, and the second recovery period RCV2, voltages (e.g., VBL_Sel and VBL_Unsel) respectively applied to the selection bit line BL_Sel and the non-selection bit line BL_Unsel may be maintained constant without increasing. In addition, the voltage (e.g., VCSL) applied to the common source line CSL may increase in the second recovery period RCV2.

Figure 13D:
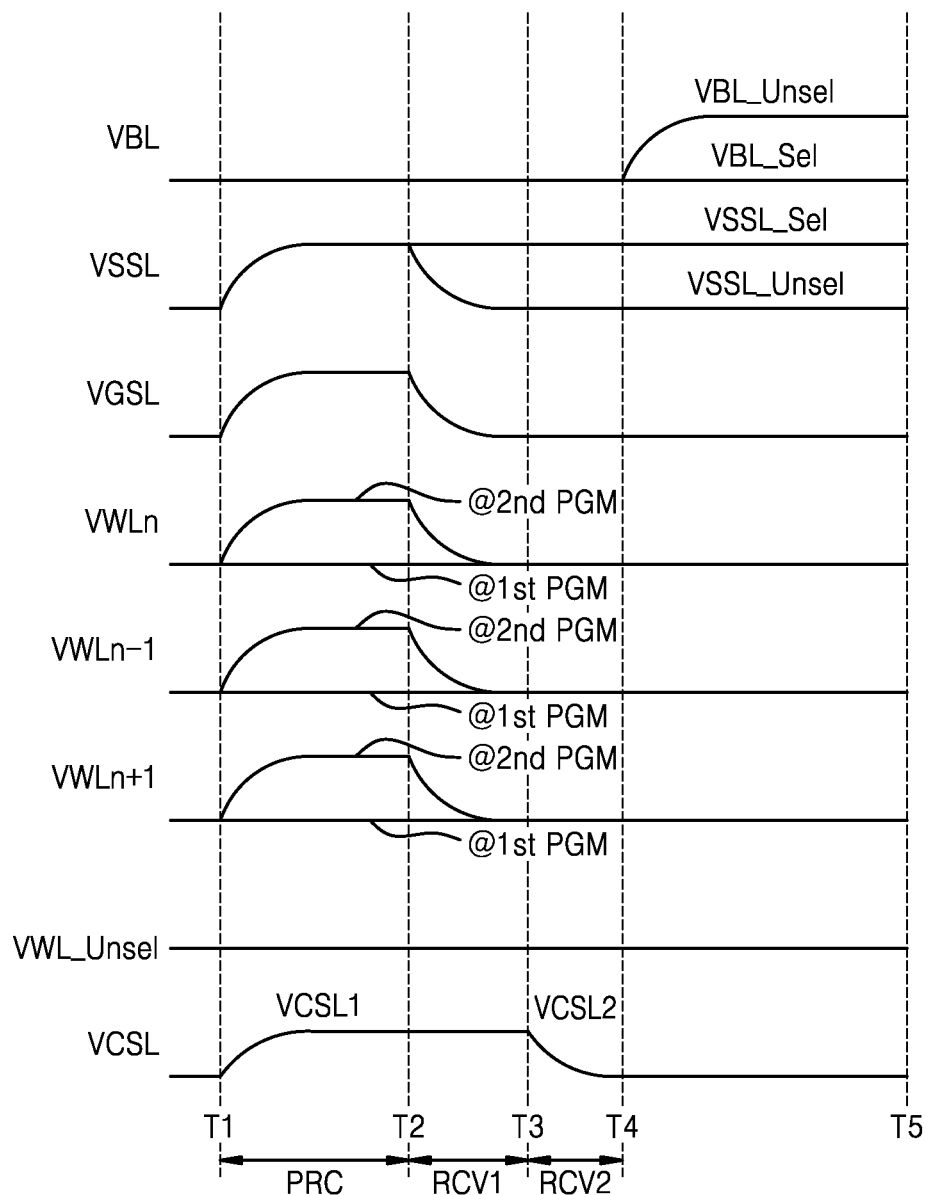

The timing diagram of FIG. 13D is similar to the timing diagram of FIG. 13C. According to the present exemplary embodiment, in the precharge period PRC, the voltage (e.g., VCSL) applied to the common source line CSL may increase. For example, in the precharge period PRC, the voltage applied to the common source line CSL may be the voltage VCSL1 at the level higher than that of the ground voltage. In addition, in the second recovery period RCV2, the voltage applied to the common source line CSL may be recovered to the voltage VCSL2 at the level higher than that before the increase.

Figure 14:
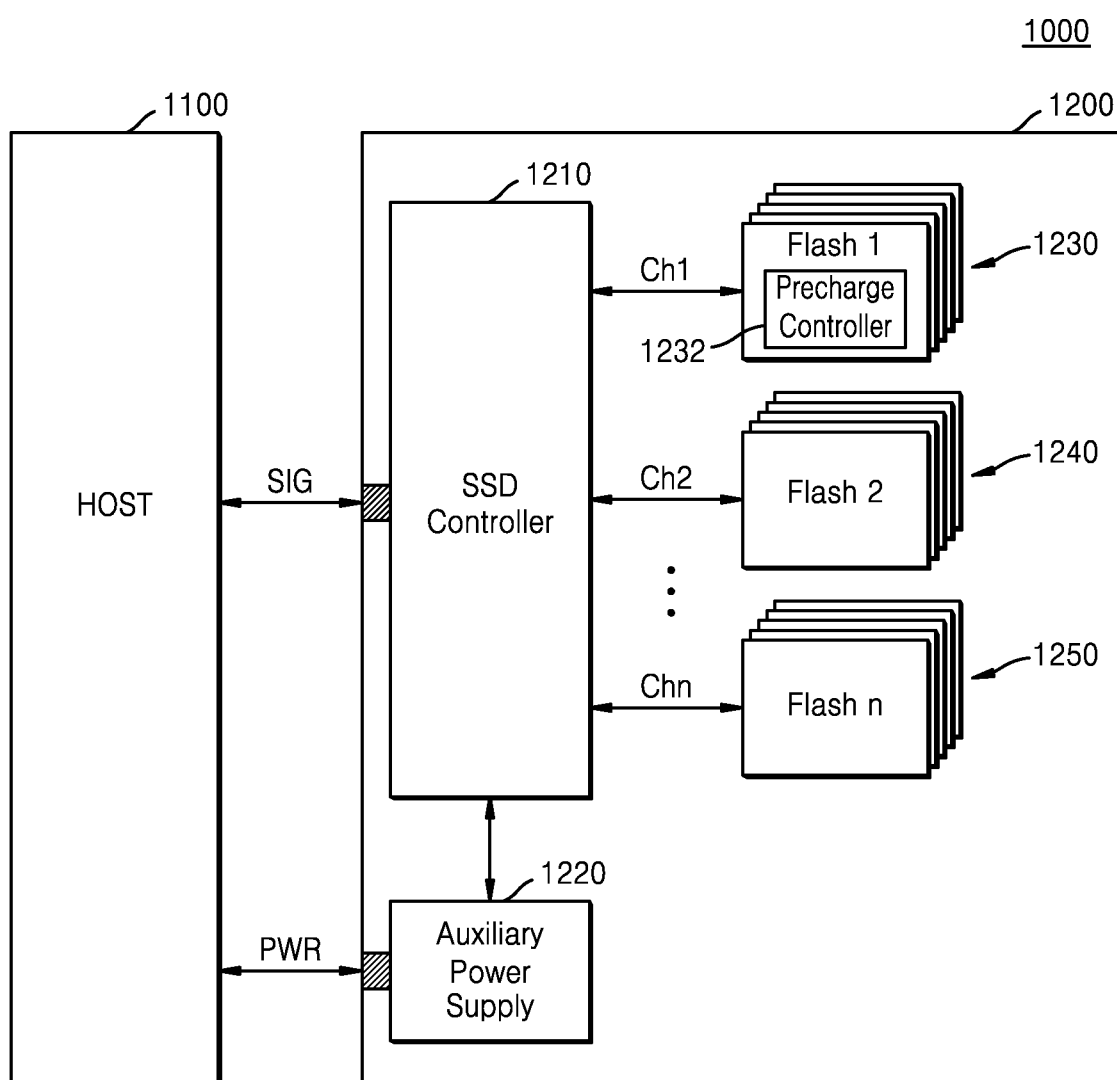
FIG. 14 is a block diagram illustrating an example in which a memory device according to an exemplary embodiment of the inventive concept is applied to a solid state drive (SSD) system.

FIG. 14 is a block diagram illustrating an example in which a memory device according to an exemplary embodiment of the inventive concept is applied to a solid state drive (SSD) system.

Referring to FIG. 14, an SSD system 1000 may include a host 1100 and an SSD 1200. The SSD 1200 transmits and receives a signal SIG to and from a signal connector and may receive power PWR through a power connector. The SSD 1200 may include an SSD controller 1210, an auxiliary power supply 1220, and memory devices 1230, 1240, and 1250 (e.g., Flash 1, Flash 2, and Flash n connected to the SSD controller 1210 via channels Ch1, Ch2, and Chn). At this time, the SSD 1200 may be implemented by using the above-described exemplary embodiments with reference to FIGS. 1 to 13D. Therefore, each of the memory devices 1230, 1240, and 1250 may perform a precharge operation. Each of the memory devices 1230, 1240, and 1250 may include a precharge control circuit 1232. Therefore, during the precharge operation, the turn-on voltage may be applied to the selection word line and the word line adjacent to the selection word line. Therefore, program performance of the SSD system 1000 may improve.

Figure 15:
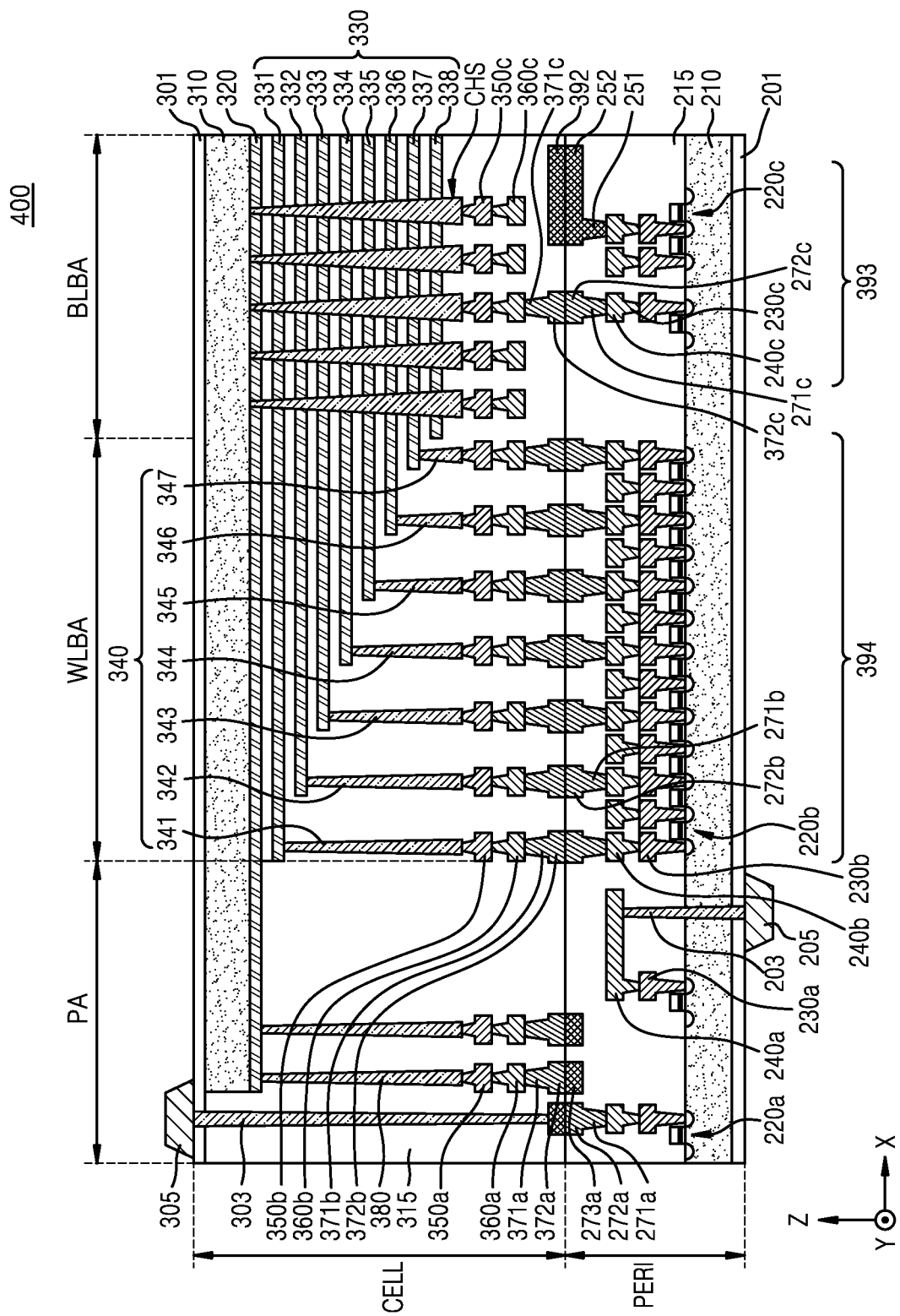
FIG. 15 illustrates a memory device having a chip-to-chip (C2C) structure, according to exemplary embodiments of the inventive concept.

FIG. 15 illustrates a memory device having a chip-to-chip (C2C) structure, according to exemplary embodiments of the inventive concepts.

Referring to FIG. 15, a memory device 400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 40 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high resistance, and the second metal layers 240a, 240b, and 240c may be formed of copper having relatively low resistance.

In an example embodiment illustrate in FIG. 15, although the first metal layers 230a, 230b, and 230c and the second metal layers 240a, 240b, and 240c are shown and described, they are not limited thereto, and one or more metal layers may be further formed on the second metal layers 240a, 240b, and 240c. At least a portion of the one or more metal layers formed on the second metal layers 240a, 240b, and 240c may be formed of aluminum or the like having a lower resistance than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to upper bonding metals 371b and 372b in the cell region CELL in a bonding manner, and the lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction, perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In an example embodiment illustrated in FIG. 15, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b providing a row decoder 394 in the peripheral circuit region PERI. In an example embodiment, operating voltages of the circuit elements 220b providing the row decoder 394 may be different than operating voltages of the circuit elements 220c providing the page buffer 393. For example, operating voltages of the circuit elements 220c providing the page buffer 393 may be greater than operating voltages of the circuit elements 220b providing the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 15, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 15, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303.

According to embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 15, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to embodiments, the first input-output pad 205 and the second input-output pad 305 may be selectively formed. For example, the memory device 400 may include only the first input-output pad 205 disposed on the first substrate 210 or the second input-output pad 305 disposed on the second substrate 310. Alternatively, the memory device 400 may include both the first input-output pad 205 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 400 may include a lower metal pattern 273a, corresponding to an upper metal pattern 372a formed in an uppermost metal layer of the cell region CELL, and having the same shape as the upper metal pattern 372a of the cell region CELL, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 252 formed in the uppermost metal layer of the peripheral circuit region PERI, and having the same shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

Figure 16:
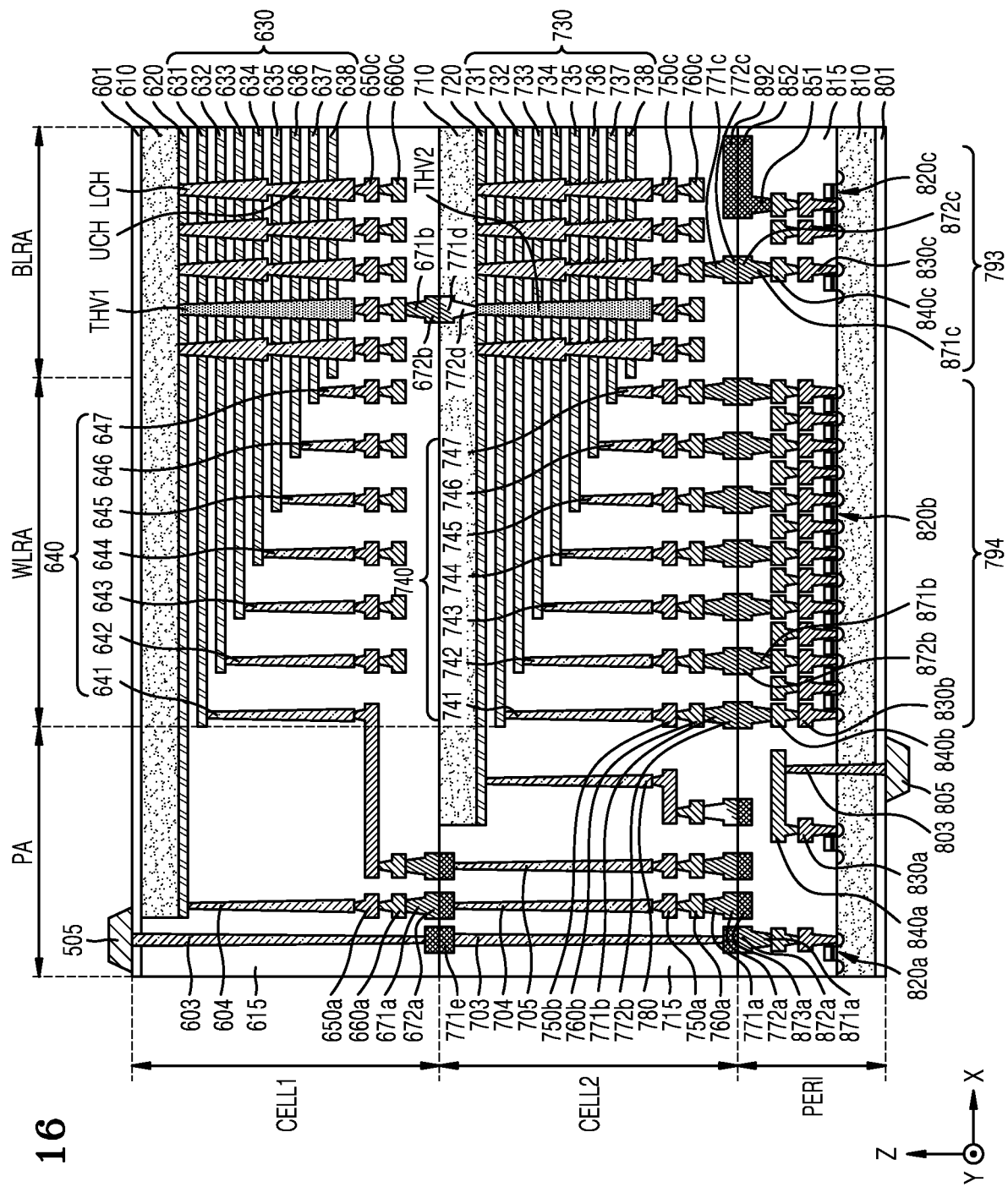
FIG. 16 illustrates a memory device having a chip-to-chip (C2C) structure, according to exemplary embodiments of the inventive concepts.

FIG. 16 illustrates a memory device having a chip-to-chip (C2C) structure, according to exemplary embodiments of the inventive concepts.

Referring to FIG. 16, unlike the memory device 400 of FIG. 15, the memory device 500 may include two or more upper chips, each including a cell region. For example, the memory device 500 may include a first upper chip including a first cell region CELL1, a second upper chip including a second cell region CELL2, and a lower chip including a peripheral circuit region PERI. The first upper chip, the second upper chip and the lower chip may be connected by a bonding method. However, the number of upper chips is not limited to thereto. Hereinafter, the above-described description through FIG. 15 may be omitted. Hereinafter, the cell region CELL may refer to at least one of the first cell region CELL1 and the second cell region CELL2.

The cell region CELL may include a lower channel LCH and an upper channel UCH connected to each other in the bit lie bonding area BLBA. The lower channel LCH and the upper channel UCH may form one channel structure. Unlike the channel structure CH of FIG. 15, the channel structure CH of FIG. 16 may be formed through a process for the lower channel LCH and a process for the upper channel UCH. In the first cell area CELL, the lower channel LCH extends in a direction perpendicular to the upper surface of the third substrate 610 to penetrate the common source line 620 and lower word lines 631 to 634. The lower channel LCH may include a data storage layer, a channel layer and a buried insulating layer, and may be connected to the upper channel UCH. The upper channel UCH may penetrate the upper word lines 635 to 638. The upper channel UCH may include a data storage layer, a channel layer and a buried insulating layer, and the channel layer of the upper channel UCH may be electrically connected to the first metal layer 650c and the second metal layer 660c. As the length of the channel increases, it may be difficult to form the channel having a constant width for process reasons. The memory device 500 according to an exemplary embodiment of the present disclosure may include a channel having improved width uniformity through the lower channel LCH and the upper channel UCH formed in a sequential process.

As described above with reference to FIG. 15, string select lines and ground select lines may be arranged on upper and lower portions of the word lines 630 and 730, respectively. According to an exemplary embodiment of the present disclosure, a word line adjacent to the string select line or a word line adjacent to the ground select line may be a dummy word line. In the memory device 500 according to an embodiment, a word line placed near a boundary between the lower channel LCH and the upper channel UCH may be a dummy word line. For example, the word line 634 and the word line 635 forming the boundary between the lower channel LCH and the upper channel UCH may be dummy word lines. The position of the dummy word line and the voltage applied to the dummy word line may be described later in detail through FIGS. 17A and 17B.

In the bit line bonding region BLBA, the first cell region CELL1 may include a first through electrode THV1, and the second cell region CELL2 may include a second through electrode THV2. have. The first through electrode THV1 may penetrate the common source line 620 and the plurality of word lines 630. The first through electrode THV1 may further penetrate the third substrate 610. The first through electrode THV1 may include a conductive material. Alternatively, the first through electrode THV1 may include a conductive material surrounded by an insulating material. The second through electrode THV1 may be the same as the first through electrode THV1. The first through electrode THV1 and the second through electrode THV2 may be electrically connected through the first through upper metal pattern 672b and the second through lower metal pattern 771d. The first through upper metal pattern 672b may be formed on the top of the first upper chip including the first cell region CELL1, and the second through lower metal pattern 771d may be formed on the bottom of the second upper chip including the second cell region CELL2. The first through electrode THV1 may be electrically connected to the first metal layer 650c and the second metal layer 660c. A first through via 671b may be formed between the second metal layer 660c and the first through upper metal pattern 672b. A second through via 772d may be formed between the second through electrode THV2 and the second through lower metal pattern 771d. The first through upper metal pattern 672b and the second through lower metal pattern 771d may be connected in a bonding manner.

According to an embodiment of the present disclosure, a first upper metal pattern 672a may be formed on the top of the first cell region CELL1, and a first lower metal may be formed on the bottom of the second cell region CELL2. The first upper metal pattern 672a of the first cell region CELL1 and the first lower metal pattern 771e of the second cell region CELL2 may be connected in the external pad bonding region PA by a bonding method. A second upper metal pattern 772a may be formed on the top of the second cell region CELL2, and a second lower metal pattern 873a may be formed on the bottom of the peripheral circuit region PERI. The second upper metal pattern 772a of the second cell region CELL2 and the second lower metal pattern 873a of the peripheral circuit region PERI may be connected in the external pad bonding region PA by a bonding method.

Figure 17A:
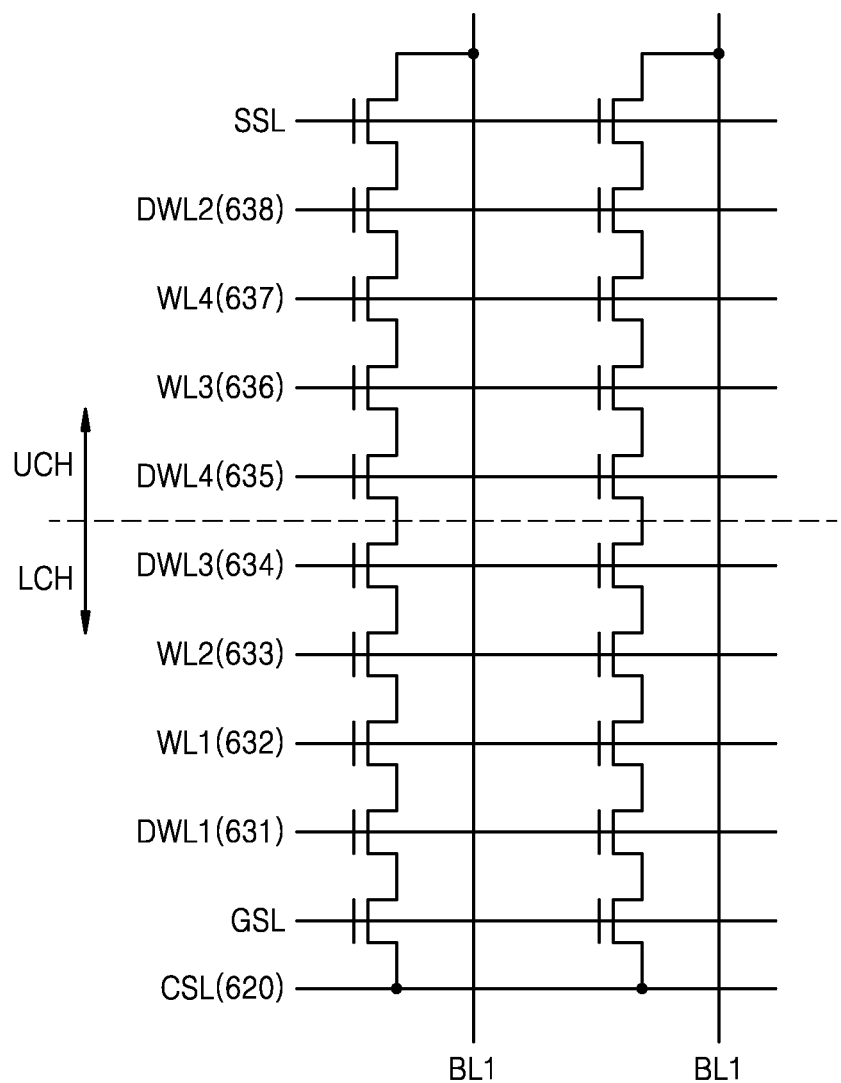
FIG. 17A illustrates a plurality of dummy word lines according to exemplary embodiments of the inventive concepts.

FIG. 17A illustrates a plurality of dummy word lines according to exemplary embodiments of the inventive concepts. Referring to FIG. 17A, the dummy word line may be adjacent to the string select line SSL and the ground select line GSL. Referring to FIG. 16, the word line 631 may be the first dummy word line DWL1 as it is adjacent to the ground select line, and the word line 638 may be the second dummy word line DWL2 because it is adjacent to the string select line. The number of dummy word lines adjacent to the string select line SSL and the ground select line GSL is not limited thereto, and plurality of dummy word lines may be adjacent to the string select line SSL and the ground select line GSL. As described above with reference to FIG. 16, the channel may include a lower channel LCH and an upper channel UCH formed in a sequential process. Due to the discontinuity of the process occurring between the lower channel LCH and the upper channel UCH, the characteristics of the lower channel LCH and the characteristics of the upper channel UCH may be different. According to an exemplary embodiment of the present disclosure, word lines placed near a boundary between the lower channel LCH and the upper channel UCH may be used as a dummy word line. For example, referring to FIG. 16, the word line 634 is the third dummy word line DWL3, and the word line 635 may be the fourth dummy word line DWL4.

Figure 17B:
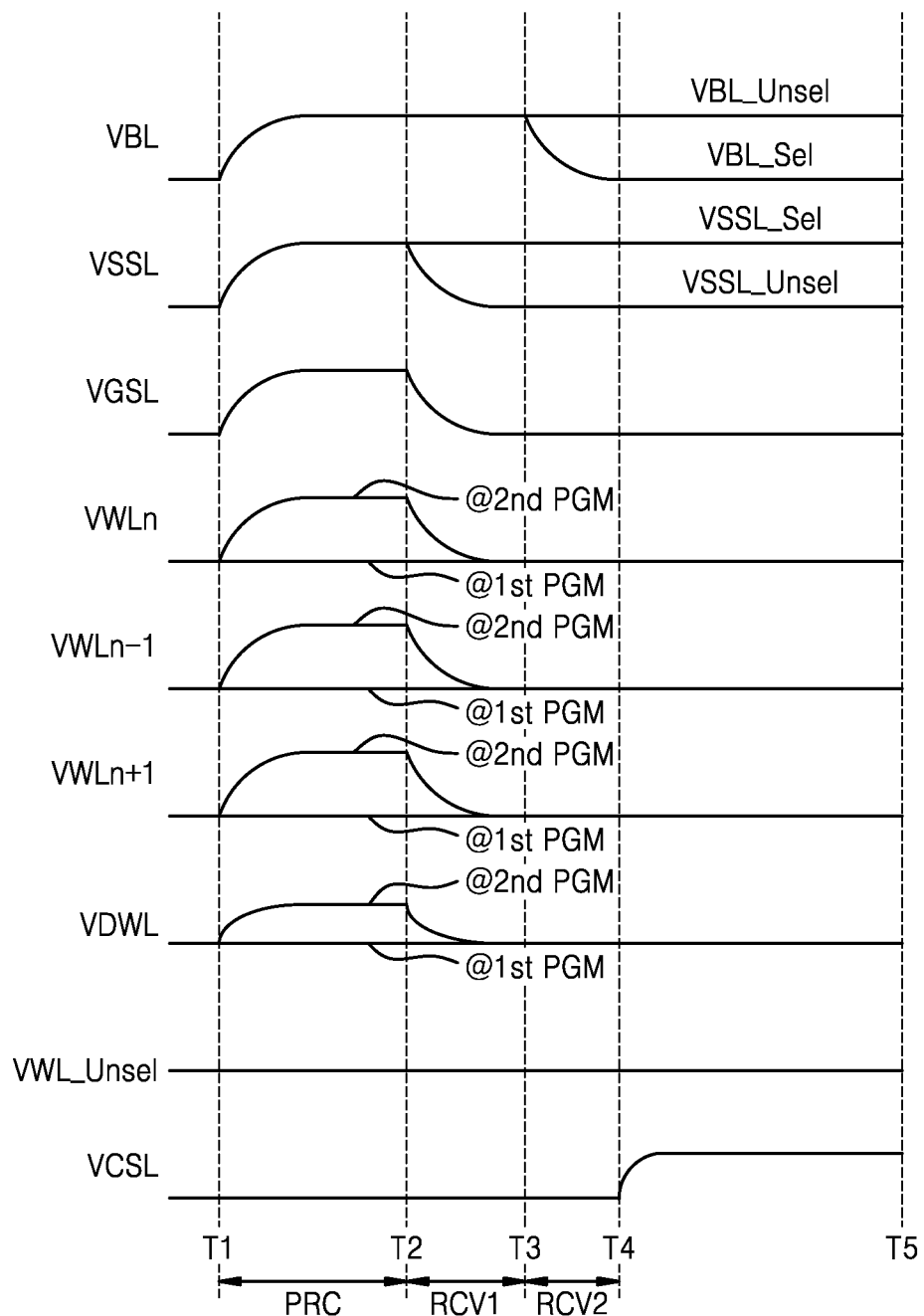
FIG. 17B is a timing diagram illustrating a method of operating a memory device, according to exemplary embodiments of the inventive concepts.

FIG. 17B is a timing diagram illustrating a method of operating a memory device, according to exemplary embodiments of the inventive concepts. Referring to FIG. 17B, the voltage VDWL applied to the dummy word line may be different with the voltages applied to the (n−1)th word line, the nth word line, and the (n+1)th word line.

Referring to FIGS. 10 and 17B, in the precharge period @1st PGM performing the first program operation 1st PGM, the first voltage may be applied to the nth word line WLn (n is a natural number) and word lines Wn−1 and WLn+1 adjacent to the nth word line WLn. Further, in the precharge period @1st PGM performing the first program operation 1st PGM, a first dummy voltage may be applied to the dummy word line. The first dummy voltage may be lower than the first voltage. In the precharge period @2nd PGM performing the second program operation 2nd PGM, second voltage at a level higher than that of the first voltage may be applied to the nth word line WLn and the word lines WLn−1 and WLn+1 adjacent to the nth word line WLn. Further, in the precharge period @2nd PGM performing the second program operation 2nd PGM, A second voltage may be applied to the dummy word line. The second dummy voltage having a higher level than the first dummy voltage. In an exemplary embodiment, in the precharge period @2nd PGM performing the second program operation 2nd PGM, the turn-on voltage may be applied to the nth word line WLn (n is a natural number) and word lines Wn−1 and WLn+1 adjacent to the nth word line WLn. Further, in the precharge period @2nd PGM performing the second program operation 2nd PGM, a third dummy voltage may be applied to the dummy word line. The third dummy voltage may be lower than the turn-on voltage. By applying a voltage lower than a voltage applied to WLn, WLn−1, WLn+1 to the dummy word line, The influence of the uneven channel width between the lower channel LCH and the upper channel UCH on the operation of the memory device can be reduced.

While the inventive concept has been particularly shown and described with reference to exemplary embodiments thereof, it will be understood by those of ordinary skill in the art that various changes in form and details may be made thereto without departing from the spirit and scope of the inventive concept as set forth by the following claims.

What is claimed is:

1. A memory device comprising:
  a memory cell region including a first metal pad;
  a peripheral circuit region including a second metal pad and being vertically connected to the memory cell region by the first metal pad and the second metal pad;
  a memory cell array provided in the memory cell region and including a plurality of cell strings including:
    a plurality of memory cells;
    a plurality of word lines respectively connected to the plurality of memory cells;
    a plurality of dummy word lines respectively connected to the plurality of memory cells;
    a plurality of bit lines connected to one side of the plurality of cell strings; and
    a ground selection line connected to the plurality of cell strings;

a control logic provided in the peripheral circuit region and including a precharge control circuit configured to control precharge on partial cell strings among the plurality of cell strings and control a plurality of data program steps on the plurality of memory cells; and a row decoder provided in the peripheral circuit region and configured to activate at least some of the plurality of word lines based on a control of the control logic, wherein the precharge control circuit is configured to control the row decoder so that, during the precharge of the partial cell strings, a turn-on voltage is applied to a selection word line and a word line adjacent to the selection word line, among the plurality of word lines, and that a voltage at a level lower than that of the turn-on voltage is applied to another word line among the plurality of word lines, wherein during the precharge of the partial cell strings, a voltage applied to the ground selection line increases, and wherein during the precharge of the partial cell strings, a level of voltage applied to the dummy word lines is lower than a level of the turn-on voltage.

2. The memory device of claim 1,
wherein the plurality of data program steps comprise:
a first program operation; and
a second program operation, the first and second program operations sequentially forming threshold voltage distributions for the plurality of memory cells, and wherein the precharge control circuit is configured to control the row decoder so that, during the second program operation, the turn-on voltage is applied to the selection word line and the word line adjacent to the selection word line.

3. The memory device of claim 2, wherein the turn-on voltage has a voltage level of no less than a threshold voltage of a memory cell on which the first program operation is performed, among the plurality of memory cells.

4. The memory device of claim 1, further comprising a page buffer provided in the peripheral circuit region for activating at least some of the plurality of bit lines based on the control of the control logic, wherein the precharge control circuit is configured to control the page buffer so that a precharge voltage is applied to partial bit lines, among the plurality of bit lines, during the precharge of the partial cell strings, and wherein a word line adjacent to the selection word line includes a word line arranged on the selection word line.

5. The memory device of claim 1,
wherein the memory cell array further comprises one or more common source lines connected to the other side of the plurality of cell strings, wherein the memory device further comprises a common source line driver configured to activate the one or more common source lines based on the control of the control logic, and wherein the precharge control circuit is configured to control the common source line driver so that a precharge voltage is applied to the one or more common source lines during the precharge of the partial cell strings.

6. The memory device of claim 1, wherein the precharge control circuit is configured to control the row decoder so that a ground voltage is applied to a word line other than the selection word line and the word line adjacent to the selection word line.

7. The memory device of claim 1, wherein the partial cell strings among the plurality of cell strings comprise one or more non-selection cell strings.

8. The memory device of claim 1, wherein the memory cell array comprises:
an upper substrate;
a plurality of gate conductive layers stacked on the upper substrate and respectively connected to the plurality of word lines; and
a plurality of channel layers that extend in a direction perpendicular to an upper surface of the upper substrate through the plurality of gate conductive layers.

9. The memory device of claim 1, wherein the first metal pad and the second metal pad are formed of copper.

10. The memory device of claim 1, wherein the first metal pad and the second metal pad are bonded to each other.

11. The memory device of claim 1, wherein the memory cell region is formed on a first wafer and the peripheral circuit region is formed on a second wafer.

12. A memory device in a Solid State Drive(SSD), comprising:
a memory cell region including a first metal pad;
a peripheral circuit region including a second metal pad and being vertically connected to the memory cell region by the first metal pad and the second metal pad;
a memory cell array provided in the memory cell region and including a plurality of cell strings including a plurality of memory cells, a plurality of word lines respectively connected to the plurality of memory cells, a plurality of dummy word lines respectively connected to the plurality of memory cells, a plurality of bit lines connected to one side of the plurality of cell strings, and a ground selection line connected to the plurality of cell strings;
a control logic provided in the peripheral circuit region and including a precharge control circuit configured to control precharging on partial cell strings among the plurality of cell strings and control a plurality of data program steps on the plurality of memory cells; and
a row decoder provided in the peripheral circuit region and configured to activate at least some of the plurality of word lines based on a control of the control logic,
wherein the precharge control circuit is configured to control the row decoder so that, during a precharge of the partial cell strings, a turn-on voltage is applied to a selection word line and a word line adjacent to the selection word line, among the plurality of word lines, and that a voltage at a level lower than that of the turn-on voltage is applied to another word line among the plurality of word lines,
wherein during the precharge of the partial cell strings, a voltage applied to a selection bit line increases, and
wherein during the precharge of the partial cell strings, a level of a voltage applied to the dummy word lines is lower than a level of the turn-on voltage.

13. The memory device of claim 12,
wherein the plurality of data program steps comprise a first program operation and a second program operation that sequentially form threshold voltage distributions for the plurality of memory cells, and
wherein the precharge control circuit is configured to control the row decoder so that, during the second program operation, the turn-on voltage is applied to the selection word line and the word line adjacent to the selection word line as a precharge.

14. The memory device of claim 12, wherein the first metal pad and the second metal pad are formed of copper.

15. The memory device of claim 12, wherein the first metal pad and the second metal pad are bonded to each other.

16. The memory device of claim 12, wherein the memory cell region is formed on a first wafer and the peripheral circuit region is formed on a second wafer.

* * * * *